US010242459B2

(12) United States Patent
Sano

(10) Patent No.: US 10,242,459 B2
(45) Date of Patent: Mar. 26, 2019

(54) AUTOMATIC DETERMINATION METHOD OF INSPECTION REGION FOR SUBSTRATE HOLDING STATE ABNORMALITY INSPECTION AND SUBSTRATE PROCESSING SYSTEM

(71) Applicant: SCREEN Holdings Co., Ltd., Kyoto (JP)

(72) Inventor: Hiroshi Sano, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 17 days.

(21) Appl. No.: 15/432,187

(22) Filed: Feb. 14, 2017

(65) Prior Publication Data

US 2017/0236303 A1 Aug. 17, 2017

(30) Foreign Application Priority Data

Feb. 17, 2016 (JP) .................................. 2016-028228

(51) Int. Cl.
*H04N 9/47* (2006.01)
*H04N 7/18* (2006.01)
(Continued)

(52) U.S. Cl.
CPC .............. *G06T 7/74* (2017.01); *G01B 11/002* (2013.01); *G01B 11/27* (2013.01); *G06K 9/2054* (2013.01); *G06K 9/3233* (2013.01); *G06K 9/4642* (2013.01); *G06K 9/56* (2013.01); *G06T 7/001* (2013.01); *H01L 21/67259* (2013.01); *H01L 21/67288* (2013.01); *H01L 21/68728* (2013.01); *H01L 21/68735* (2013.01); *H01L 21/68785* (2013.01); *H01L 22/12* (2013.01); *G06K 2209/19* (2013.01); *G06T 2207/30148* (2013.01)

(58) Field of Classification Search
None
See application file for complete search history.

(56) References Cited

U.S. PATENT DOCUMENTS

2005/0254699 A1 11/2005 Sano et al. .................... 382/149
2005/0259874 A1 11/2005 Sano et al. .................... 382/218
(Continued)

FOREIGN PATENT DOCUMENTS

JP 10-321705 A 12/1998
JP 2001-101402 A 4/2001
(Continued)

*Primary Examiner* — Talha M Nawaz
(74) *Attorney, Agent, or Firm* — Ostrolenk Faber LLP

(57) ABSTRACT

With regard to an inspection region for inspecting abnormality of a holding state of the substrate in an image of the substrate holding unit, (1) an upper end surface of the substrate being normally held by the substrate holding unit is confirmed, (2) based on a position of the upper end surface of the substrate that has been confirmed, a position of the inspection region in a vertical direction is determined, and (3) for a candidate of the inspection region of which the position in the vertical direction has been determined, density thereof at a rotation start time of the substrate holding unit is obtained, a horizontal position of the inspection region is determined based on a difference image integrated value, which is an integrated value of a difference absolute value with density of the same region in an initial state of the substrate holding unit.

16 Claims, 17 Drawing Sheets

(51) Int. Cl.

| | | |
|---|---|---|
| *G06T 7/73* | (2017.01) | |
| *G01B 11/00* | (2006.01) | |
| *G06K 9/20* | (2006.01) | |
| *G06T 7/00* | (2017.01) | |
| *H01L 21/67* | (2006.01) | |
| *H01L 21/687* | (2006.01) | |
| *H01L 21/66* | (2006.01) | |
| *G06K 9/32* | (2006.01) | |
| *G06K 9/46* | (2006.01) | |
| *G06K 9/56* | (2006.01) | |
| *G01B 11/27* | (2006.01) | |

(56) References Cited

U.S. PATENT DOCUMENTS

| | | | |
|---|---|---|---|
| 2006/0018540 A1 | 1/2006 | Imamura et al. | 382/173 |
| 2007/0058853 A1* | 3/2007 | Minakata | G06T 7/0004 382/145 |
| 2009/0304259 A1* | 12/2009 | Yamamoto | G06T 7/0004 382/145 |
| 2013/0314531 A1* | 11/2013 | Abe | G06T 7/0004 348/126 |
| 2015/0262848 A1 | 9/2015 | Sano et al. | 156/345.17 |

FOREIGN PATENT DOCUMENTS

| | | |
|---|---|---|
| JP | 2012-242291 A | 12/2012 |
| JP | 2016-025293 A | 2/2016 |
| TW | 200540392 A | 12/2005 |
| TW | 200540411 A | 12/2005 |
| TW | 200605642 A | 2/2006 |
| TW | 201538231 A | 10/2015 |

* cited by examiner

| CutSum | OFFSET FROM ROTATION START FRAME | AVERAGE DENSITY VARIATION VALUE OF RECOMMENDED DREGION | | |
|---|---|---|---|---|
| PICTURE NO. | | 230 | 201 | 231 |
| AT STOP | -12 | | | 0.205 |
| | -11 | | 0.381 | 0.203 |
| | -10 | 0.199 | 0.334 | 0.197 |
| | -9 | 0.175 | 0.323 | 0.212 |
| | -8 | 0.168 | 0.259 | 0.193 |
| | -7 | 0.221 | 0.328 | 0.182 |
| | -6 | 0.187 | 0.265 | 0.189 |
| | -5 | 0.166 | 0.315 | 0.204 |
| | -4 | 0.224 | 0.322 | 0.218 |
| | -3 | 0.181 | 0.350 | 0.225 |
| GRAY AREA | -2 | 0.191 | 0.306 | 0.206 |
| | -1 | 0.848 | 0.282 | 0.232 |
| ROTATING | 0 | 20.123 | 3.828 | 3.004 ← fstr |
| | 1 | 62.337 | 17.360 | 31.340 |
| | 2 | 49.995 | 36.713 | 39.289 |
| | 3 | 48.194 | 52.178 | 65.052 |
| | 4 | | 22.264 | 28.507 |

FIG. 8

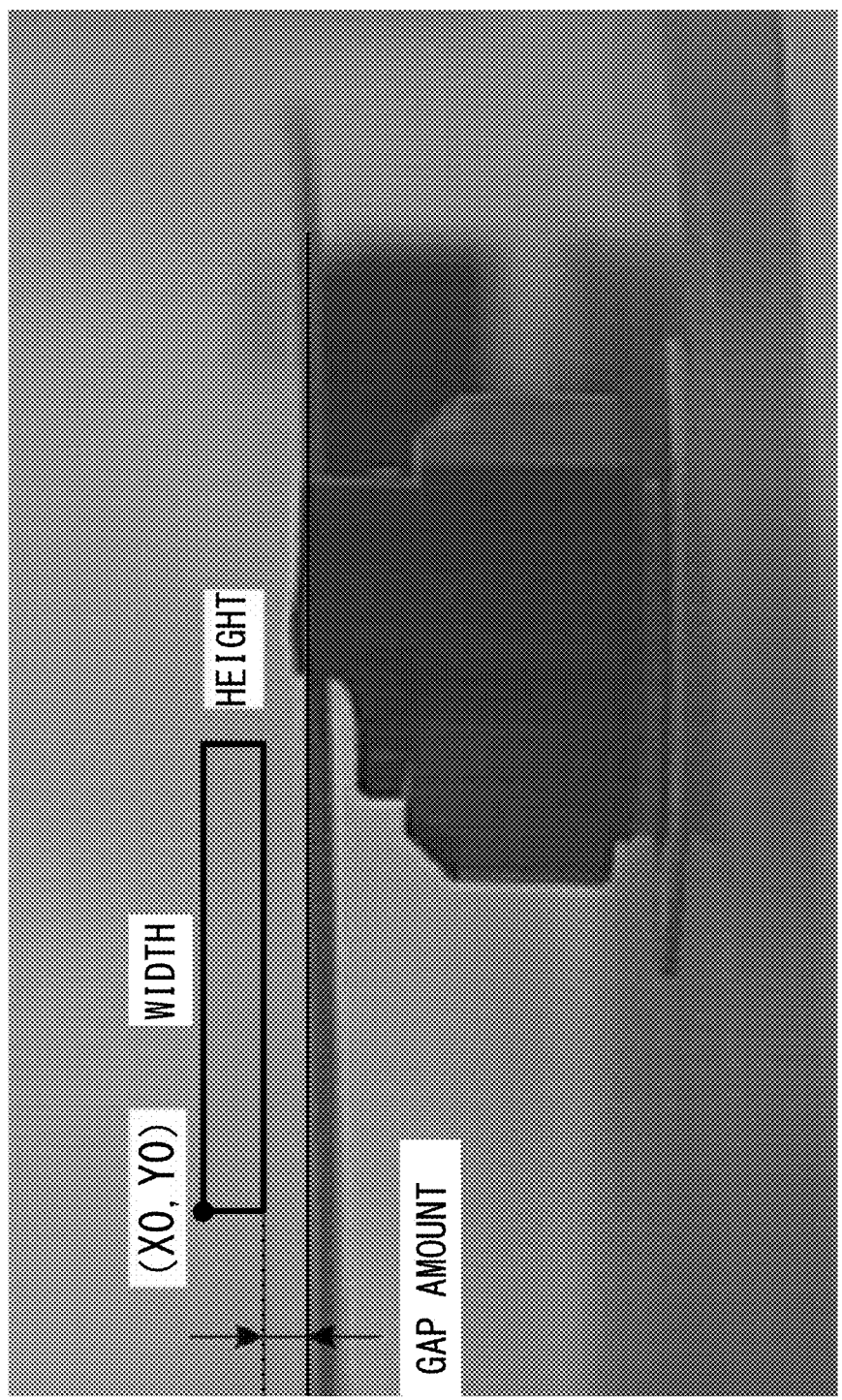

AUTOMATIC DETERMINATION METHOD OF INSPECTION REGION FOR SUBSTRATE HOLDING STATE ABNORMALITY INSPECTION AND SUBSTRATE PROCESSING SYSTEM

CROSS-REFERENCE TO RELATED APPLICATION

This application is based upon and claims the benefit of priority of the prior Japanese Patent Application No. 2016-028228, filed on Feb. 17, 2016, the entire contents of which are incorporated herein by reference.

BACKGROUND

Technical Field

The present invention relates to a substrate holding inspection method in which it is inspected whether or not a substrate is properly held by a substrate holding unit in a case where the substrate is fixed and is rotary processed by a semiconductor manufacturing system and the like, and to a substrate processing system that performs substrate processing by using the substrate holding inspection method. More specifically, the present invention relates to an automatic determination method of an inspection region of substrate holding state abnormality inspection.

Related Art

In a semiconductor manufacturing system and the like, as a technique for performing various processing such as cleaning and coating on a semiconductor substrate such as a wafer (hereinafter, simply referred to as the substrate), there is a substrate processing system that performs the processing by holding the substrate in a substantially horizontal attitude by a substrate holding member and by supplying process liquid while rotating the substrate. To enable high-speed rotation of the substrate, such substrate processing system has a plurality of substrate holding members on a circumference corresponding to an outer peripheral shape of a substrate W at an appropriate interval as illustrated in FIG. 16. The substrate holding members include a fixing holding member 101 for holding the substrate in a fixed state, and an opening and closing holding member 102 for opening and closing when attaching and detaching the substrate W to and from the system.

The fixing holding member 101 includes a fixed shaft 101a fixed to a base 103, and a fixed piece 101b fixed to the fixed shaft 101a, having a drum shape, and supporting a peripheral portion of the substrate W with a recessed portion on a lateral face thereof. The opening and closing holding member 102 includes a rotation shaft 102a fixed to the base 103, and an opening and closing piece 102b having a drum shape with a notch portion 102c formed in a part thereof and being eccentrically and rotatably fixed to the rotation shaft 102a.

Then, to attach and detach the substrate W to and from the system, the opening and closing piece 102b is rotated on the rotation shaft 102a, the opening and closing piece 102b is moved in a direction away from the substrate W, and the notch portion 102c is faced to the substrate W, whereby abutting of the substrate holding members on the peripheral portion of the substrate W is released. On the other hand, to fix the substrate W to the system, the opening and closing piece 102b is rotated on the rotation shaft 102a, the opening and closing piece 102b is moved in a direction approaching the substrate W, and the notch portion 102c is moved to a position not facing the substrate W. Accordingly, all of the substrate holding members abut on the peripheral portion of the substrate W, whereby the substrate W is sandwiched thereby and held in the horizontal attitude.

However, due to a reason that the substrate W rides on a slant face of the recessed portion of the opening and closing piece 102b or the fixed piece 101b and the like, holding of the substrate W by the substrate holding members may be incomplete, or the substrate W may be held in a tilted state against a rotation axis thereof. Starting the processing of the substrate W in such state may cause a problem in that, due to rotation thereof, the substrate W may drop off from the substrate holding member and be damaged or the system itself may be damaged. To avoid such problem, there have been proposed an inspection system and an inspection method with which a position is inspected by imaging at least an outer peripheral portion of a disk-shaped object to be measured placed on a rotary table by a camera, by processing an image signal that has been imaged, and by comparing image information with standard image information stored in advance in a storage unit (see, for example, JP H10-321705 A).

As such system, there is also a system that inspects a holding state of the substrate by detecting a change in density (or brightness, the same for the "density" hereinafter) in a part of a region of a photographed image after a rotation start of the substrate W and the substrate holding member. An exemplary photographed image in this case is illustrated in FIG. 17. In FIG. 17, there are defined a rotation start determination region 121 for determining the rotation start of the substrate W and the substrate holding member with high sensitivity, and a chuck abnormality determination region 122 for determining abnormality of the holding state of the substrate with high sensitivity. Particularly from a density change in the rotation start determination region 121 and the chuck abnormality determination region 122, the rotation start of the substrate W and the substrate holding member and abnormality of the holding state of the substrate W are detected.

Here, the above-described rotation start determination region 121 and the chuck abnormality determination region 122 as well as a threshold for determining each of the regions are often set by an engineer who is present at a time of delivering the system. The engineer, however, may not always have detailed knowledge of image processing and camera adjustment/optical adjustment, whereby it is sometimes difficult to appropriately set the rotation start determination region 121 and the chuck abnormality determination region 122 as well as the threshold for determining each of the regions. Furthermore, in a case where a position of the camera for photographing an image of the substrate W and the substrate holding member is changed after the system is started to be used, it is necessary to reset the rotation start determination region 121 and the chuck abnormality determination region 122 as well as the threshold for determining each of the regions, and in such case, a user needs to take an action each time to perform resetting by himself, to request for an engineer having expertise to be dispatched, or the like, whereby it has been imposing a heavy workload on the user.

SUMMARY

The present invention has been devised in view of the above-described situation, and an objective thereof is to provide a technique capable of reducing the workload by detecting a density change between images before and after a rotation start of the substrate and the substrate holding member and by automatically determining an inspection region particularly to be focused on within the images in a case where abnormality of a holding state of the substrate is inspected.

In order to solve the above issue, the present invention is an automatic determination method of an inspection region for abnormality inspection of a substrate holding state in a substrate processing system including: a substrate holding unit configured to rotate a substrate being held in a substantially horizontal attitude; a processing control unit configured to add predetermined processing to the substrate in a state where the substrate holding unit is rotated; and an abnormality inspection unit configured to inspect abnormality of a holding state of the substrate by the substrate holding unit, the abnormality inspection unit including: an imaging unit configured to acquire a first image by photographing the substrate being held by the substrate holding unit from a horizontal direction; a cut out unit configured to cut out, from the first image, a second image corresponding to the inspection region positioned above the substrate being properly held by the substrate holding unit; and a determination unit configured to obtain a feature quantity indicating the holding state of the substrate by the substrate holding unit and to perform abnormality determination of the holding state based on the feature quantity on the second image, the automatic determination method including: upper end surface confirming in which an upper end surface of the substrate being normally held by the substrate holding unit is confirmed in the first image; vertical position determining in which a position of the inspection region in a vertical direction is determined based on a position of the upper end surface of the substrate in the first image having been confirmed in the upper end surface confirming; and horizontal position determining in which, for a candidate of the inspection region for which the position in the vertical direction has been determined, density at a rotation start time of the substrate holding unit is obtained, a difference image integrated value being an integrated value of a difference absolute value with density of the same region in an initial state of the substrate holding unit is obtained, and a horizontal position of the inspection region is determined based on the difference image integrated value having been obtained.

That is, in the present invention, an inspection region for inspecting abnormality of a holding state of the substrate is positioned above the substrate that is properly held by a substrate holding unit, and the inspection region is determined as follows. Specifically, in an upper end surface confirming step, an upper end surface of the substrate being normally held by the substrate holding unit is confirmed within a first image. In a vertical position determination step, based on a position of the upper end surface of the substrate that has been confirmed, a position of the inspection region in a vertical direction is determined. Furthermore in a horizontal position determination step, for a candidate of the inspection region of which the position in the vertical direction has been determined, density thereof at a rotation start time of the substrate holding unit is obtained, a difference image integrated value, which is an integrated value of a difference absolute value with density of the same region in an initial state of the substrate holding unit, is obtained, and a horizontal position of the inspection region is determined based on the difference image integrated value that has been obtained.

Accordingly, it is possible to automatically set the inspection region by using the upper end surface of the substrate being normally held by the substrate holding unit as a reference to a position higher by a predetermined gap amount from the upper end surface of the substrate. As a result, by appropriately setting the gap amount in advance, it is possible to automatically determine the inspection region with which it is possible to determine abnormality of the holding state of the substrate with higher accuracy.

In addition, it is preferred that the inspection region be set to a place where there is a smallest possible change within the image due to a factor other than a face deflection of the substrate. Thus, for the candidate of the inspection region of which the position in the vertical direction has been determined, the density thereof at the rotation start time of the substrate holding unit is obtained, and the horizontal position of the inspection region is determined based on the difference image integrated value, which is the integrated value of the difference absolute value with the density of the same region in the initial state of the substrate holding unit. Accordingly, it is possible to suppress inconvenience that the inspection region is automatically set to a position at which the image is largely changed from that in the initial state due to the factor such as the face deflection of the substrate.

In the present invention, in the horizontal position determining, the horizontal position of the inspection region may be a position at which the difference image integrated value is the minimum.

Accordingly, it is possible to more certainly reduce a possibility that a second image within the inspection region is influenced by a shadow that moves when the substrate holding unit is rotated and the like. It is also possible to relatively increase a degree of influence on the second image due to the face deflection of the substrate, whereby it is possible to perform abnormality determination of the holding state of the substrate with high sensitivity.

In the present invention, in the upper end surface confirming, the position of the upper end surface of the substrate may be confirmed to a position at which a difference value of density between a pixel at a predetermined horizontal position of the first image and an adjacent pixel related to the vertical direction is equal to or greater than a predetermined multiple of a standard deviation of density in each pixel related to the vertical direction. Accordingly, it is possible to automatically confirm the upper end surface of the substrate being normally held by the substrate holding unit by using easier algorithm.

In the present invention, the feature quantity may be determined based on the difference image integrated value, and a threshold of the feature quantity used for the abnormality determination of the holding state of the substrate may be determined based on an average value and a standard deviation of the difference image integrated value in the inspection region of the first image during rotation of the substrate holding unit. Accordingly, the threshold that is compared with a feature quantity in determining whether or not the holding state of the substrate is abnormal may be determined based on statistical data of the difference image integrated value of the inspection region within the first image during rotation of the substrate holding unit.

In the present invention, the first image at the rotation start time of the substrate holding unit may be an image in which the substrate being held by the substrate holding unit is photographed from the horizontal direction by the imaging unit at a point of time when the difference image integrated value within a predetermined rotation start determination region exceeds a predetermined second threshold.

That is, as a determination reference for determining the rotation start time of the substrate holding unit from the image, it is focused on the difference image integrated value of a rotation start determination region. Then, a point of time when the difference image integrated value of the rotation start determination region exceeds a second threshold is determined as the rotation start time. Accordingly, a time at which a change in a specific region of the image becomes larger than a certain degree from the initial state (stopped state) may be determined as the rotation start time. That is, the rotation start time may be determined by capturing a change caused in the image due to the rotation of the substrate holding unit, whereby it is possible to determine the rotation start time with higher accuracy by using the easier algorithm.

In the present invention, a position of the rotation start determination region may be determined to a position at which the difference image integrated value is the maximum in the first image among the plurality of first images photographed for every predetermined period from a stopped state of the substrate holding unit to after a rotation start thereof, the first image being photographed before the first image for which the difference image integrated value is the maximum for the whole first images, and the first image being immediately before the first image in which a change of the difference image integrated value from the previous first image exceeds a predetermined third threshold.

Accordingly, first, it is possible to focus on the first image at a point of time when the difference image integrated value is increasing but has not become the maximum yet and is not very large, that is, in a state where the image has started to change due to the rotation start of the substrate holding unit. Then, within such first image, it is possible to set a region having the maximum difference image integrated value, that is, a region in which the image changes the largest by the rotation start, as the rotation start determination region. As a result, it is possible to detect the rotation start of the substrate holding unit with high sensitivity or with higher accuracy.

In the present invention, the second threshold may be determined based on an average value and a standard deviation of the difference image integrated value of the rotation start determination region of the first image during a stop of the substrate holding unit.

Accordingly, by focusing on the rotation start determination region as the region in which the image changes the largest by the rotation of the substrate holding unit as described above, it is possible to determine that the rotation is started from a change in the difference image integrated value exceeding a predetermine amount (second threshold) in the rotation start determination region. Then, it is possible to appropriately determine the second threshold based on the statistical data of the difference image integrated value in the rotation start determination region of the first image during a stop of the substrate holding unit.

For example, by setting the second threshold as an average value+3*standard deviation of the difference image integrated value during a stop of the substrate holding unit, it is possible to suppress inconvenience of being erroneously determined that the rotation of the substrate holding unit is started due to a statistical variation of the difference image integrated value although the substrate holding unit is during a stop.

In the present invention, the second threshold may be further determined based on a maximum value (MaxV) of the difference image integrated value of the rotation start determination region of the first image during a stop of the substrate holding unit and a minimum value (MinV) of the difference image integrated value of the rotation start determination region of the first image at the rotation start time.

Here, in a case where there are multiple sets of the plurality of first images of the substrate and the substrate holding unit before and after the rotation start, in whole data of the multiple sets, it is possible that a minimum value (MinV) of the difference image integrated value of the rotation start determination region of the first image at the rotation start time becomes smaller than the average value+3*standard deviation of the difference image integrated value during the stop. It is considered that such situation is caused by an abnormally large variation in the difference image integrated value of the rotation start determination region of the first image during the stop or at the rotation start time.

According to the present invention, in such case, it is possible to specify the second threshold not by the average value+3*standard deviation of the difference image integrated value and the like but by MaxV+(MinV−MaxV)*α (0<α<1), for example. Then, it is possible to set the second threshold to a numerical value equal to or greater than the difference image integrated value during the stop and equal to or smaller than the difference image integrated value at the rotation start time, whereby it is possible to more certainly determine the rotation start of the substrate and the substrate holding unit.

The present invention may be a substrate processing system including: a substrate holding unit configured to rotate a substrate being held in a substantially horizontal attitude; a processing control unit configured to add predetermined processing to the substrate in a state where the substrate holding unit is rotated; and an abnormality inspection unit configured to inspect abnormality of a holding state of the substrate by the substrate holding unit, the abnormality inspection unit including: an imaging unit configured to acquire a first image by photographing the substrate being held by the substrate holding unit from a horizontal direction; a cut out unit configured to cut out, from the first image, a second image corresponding to an inspection region positioned above the substrate being properly held by the substrate holding unit; and a determination unit configured to obtain a feature quantity indicating the holding state of the substrate by the substrate holding unit and to perform abnormality determination of the holding state based on the feature quantity on the second image, the substrate processing system further including: an inspection region determination unit configured to determine the inspection region for abnormality inspection of the holding state of the substrate, wherein the inspection region determination unit includes: an upper end surface confirmation unit configured to confirm an upper end surface of the substrate being normally held by the substrate holding unit in the first image; a vertical position determination unit configured to determine a position of the inspection region in a vertical direction based on a position of the upper end surface of the substrate in the first image having been confirmed by the upper end surface confirmation unit; and a horizontal position determination unit configured to, for a candidate of the inspection region for which the position in the vertical direction has been determined, obtain density at a rotation start time of the substrate holding unit, obtain a difference image integrated value being an integrated value of a difference absolute value with density of the same region in an initial state of the substrate holding unit, and determine a horizontal position of the inspection region based on the difference image integrated value having been obtained.

The present invention may be the above described substrate processing system, wherein the horizontal position determination unit positions the horizontal position of the inspection region to a position at which the difference image integrated value is the minimum.

The present invention may be the above described substrate processing system, wherein the upper end surface confirmation unit confirms the position of the upper end surface of the substrate to a position at which a difference value of density between a pixel at a predetermined horizontal position of the first image and an adjacent pixel related to the vertical direction is equal to or greater than a predetermined multiple of a standard deviation of density in each pixel related to the vertical direction.

The present invention may be the above described substrate processing system, wherein the feature quantity is determined based on the difference image integrated value, and a threshold of the feature quantity used for the abnormality determination of the holding state of the substrate is determined based on an average value and a standard deviation of the difference image integrated value in the inspection region of the first image during rotation of the substrate holding unit.

The present invention may be the above described substrate processing system, wherein the first image at the rotation start time of the substrate holding unit is an image in which the substrate being held by the substrate holding unit is photographed from the horizontal direction by the imaging unit at a point of time when the difference image integrated value within a predetermined rotation start determination region exceeds a predetermined second threshold.

The present invention may be the above described substrate processing system, wherein a position of the rotation start determination region is determined to a position at which the difference image integrated value is the maximum in the first image among the plurality of first images photographed for every predetermined period from a stopped state of the substrate holding unit to after a rotation start thereof, the first image being photographed before the first image for which the difference image integrated value is the maximum for the whole first images, and the first image being immediately before the first image in which a change of the difference image integrated value from the previous first image exceeds a predetermined third threshold.

The present invention may be the above described substrate processing system, wherein the second threshold is determined based on an average value and a standard deviation of the difference image integrated value of the rotation start determination region of the first image during a stop of the substrate holding unit.

The present invention may be the above described substrate processing system, wherein the second threshold is further determined based on a maximum value of the difference image integrated value of the rotation start determination region of the first image during a stop of the substrate holding unit and a minimum value of the difference image integrated value of the rotation start determination region of the first image at the rotation start time.

Note that the above-described Solution to Problem may be combined as appropriate when used.

According to the present invention, it is possible to decrease the workload by automatically determining the inspection region particularly to be focused on within the images, in a case where the abnormality of the holding state of the substrate is inspected by detecting the density change between the images before and after the rotation start of the substrate and the substrate holding member.

BRIEF DESCRIPTION OF DRAWINGS

FIG. 8 is a table illustrating an average density variation value of the rotation start determination region of three sets of pictures of a spin unit from a stopped state to a rotation start according to the example of the present invention;

FIG. 13 is a graph illustrating a width and a height of a chuck abnormality determination region and a gap amount from an upper end surface of a wafer according to the example of the present invention;

DETAILED DESCRIPTION

First Example

Hereinafter, an example of the present invention is described with reference to the drawings. The example described below is one aspect of the present invention and is not intended to limit the technical scope of the present invention.

Figure 1:
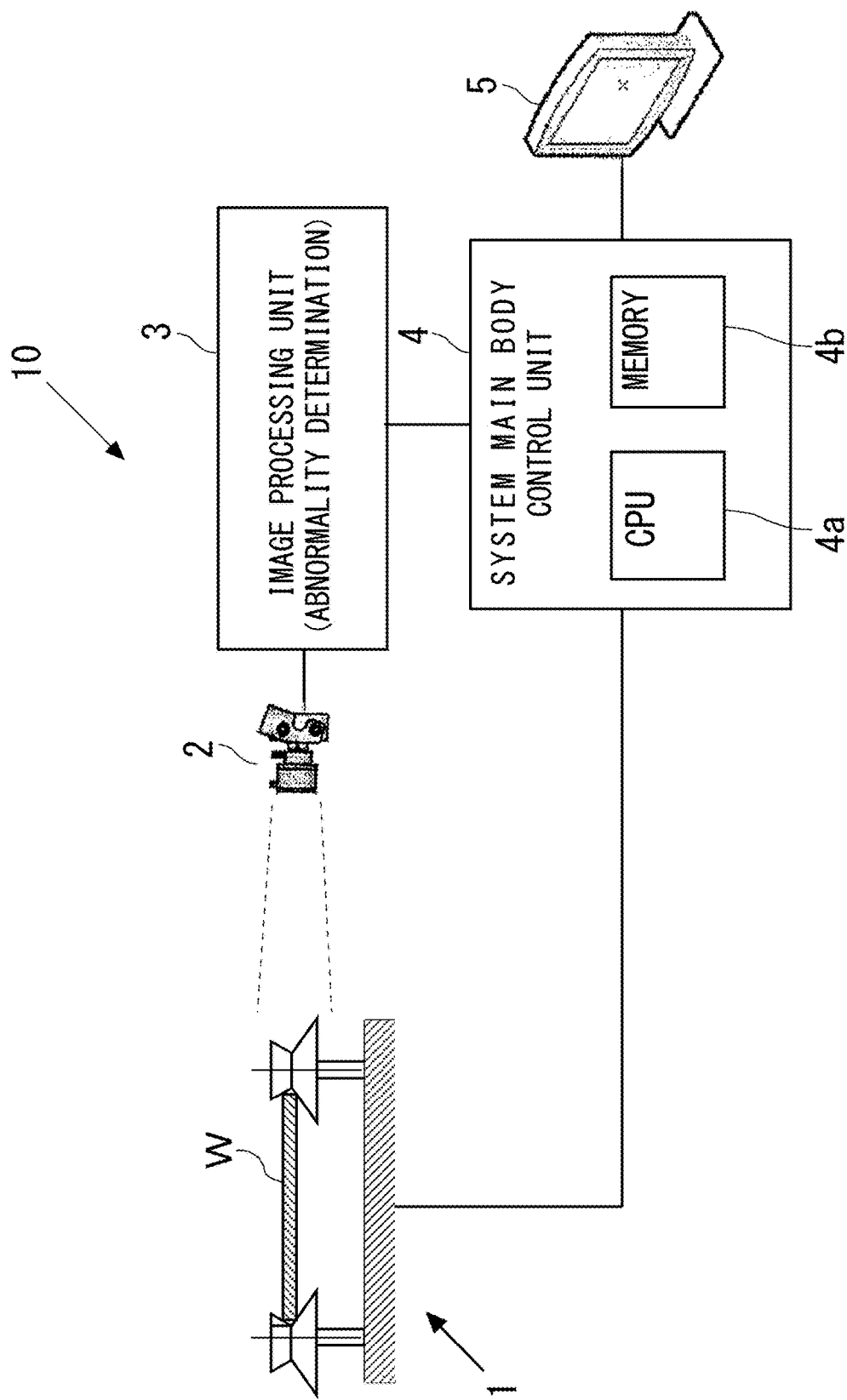
FIG. 1 is a diagram illustrating a system configuration of a substrate processing system according to an example of the present invention.

In FIG. 1, a system configuration of a substrate processing system 10 according to this example is illustrated. This system includes a spin unit 1 including a substrate holding member, a camera 2, an image processing unit 3, an system main body control unit 4, and a display unit 5.

In this system, in a state where a substrate W is rotated at a predetermined rotation speed by rotation of the spin unit 1 as a substrate holding unit, processing of the substrate W is performed by supplying a process liquid to the substrate W from a process liquid discharge unit (not illustrated). The processing of the substrate W here may include cleaning, surface treatment, and the like of the substrate W, for example. The process liquid supplied to a vicinity of a rotation center of the substrate W is spread toward an outer periphery side by a centrifugal force accompanying rotation of the substrate W, and finally, the process liquid is spun off from a peripheral edge portion of the substrate W to a side.

The camera 2 as an imaging unit acquires an image of the substrate W by imaging the spin unit 1 and the substrate W, which is held by the spin unit 1, from a horizontal direction. Hereinafter, the image photographed by the camera 2 may be referred to as a "horizontal image". The horizontal image is equivalent to a first image according to the present invention. The horizontal image that has been acquired by the camera 2 is transmitted to the image processing unit 3. The image processing unit 3 performs predetermined image processing on the horizontal image and acquires information required for determining a holding state of the substrate W.

The system main body control unit 4 of the substrate processing system 10 is provided with a CPU 4a that controls an operation of each unit by executing a predetermined processing program, performs determination of the holding state of the substrate W, and performs the processing of the substrate W. The system main body control unit 4 is also provided with a memory 4b for storing and saving the processing program executed by the CPU 4a, data generated during processing, and the like. The system main body control unit 4 is connected to the display unit 5 for informing a user of a progress state of the processing, occurrence of abnormality, and the like as necessary. In this example, the system main body control unit 4 is equivalent to a processing control unit. Furthermore, an abnormality inspection unit is constituted of the image processing unit 3 and the system main body control unit 4.

Figure 2:
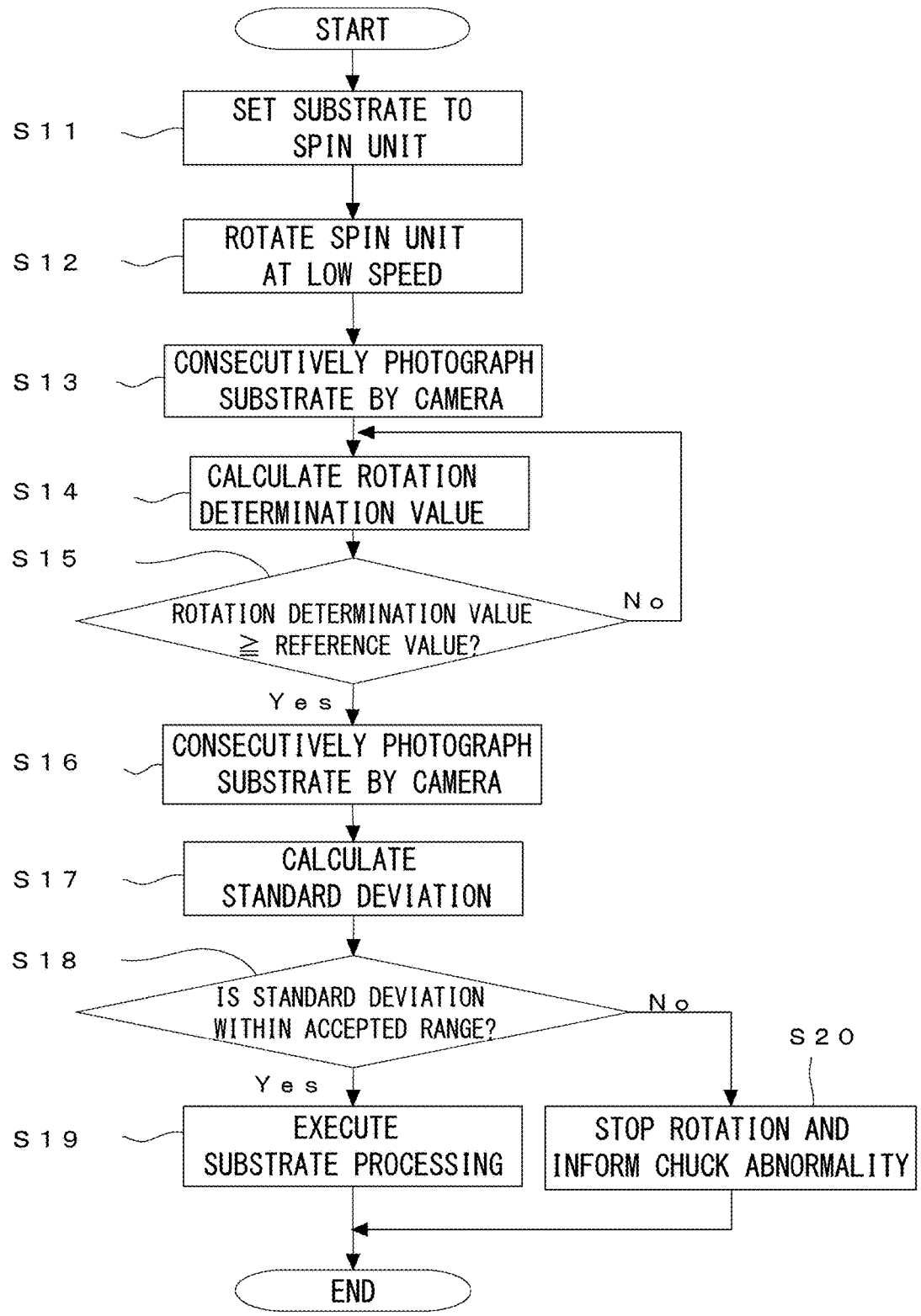
FIG. 2 is a flowchart illustrating an operation of the substrate processing system according to the example of the present invention.

FIG. 2 is a flowchart illustrating an operation of the substrate processing system 10. At least a part of this operation is achieved as a result of execution of a predetermined processing program by the CPU 4a. First, in processing in step S11, the substrate W is set to the spin unit 1. Here, in a case where the substrate W is normally set to the spin unit 1, the substrate W is mechanistically held in a horizontal attitude. However, it is possible that the substrate W is set to the spin unit 1 abnormally due to reasons such as the substrate W is set in a state of running on any of the substrate holding members, the substrate holding members are not capable of horizontally holding the substrate W because a shape of the substrate holding members of the spin unit 1 has gradually been changed due to corrosion by a chemical liquid or the substrate W is held in an eccentric state, for example.

When the spin unit 1 and the substrate W are rotated in this state, there is a fear that the substrate W may drop off from the substrate holding members and may be damaged or that the substrate W may collide into another member inside the system and may damage the system. Even when the substrate W does not drop off, due to the substrate W rotating in a tilted or eccentric state, there is a fear that abnormal vibration, which may be a cause of failure, may occur in the system. To prevent such problem in advance, in this example, it is checked that the substrate W is normally rotated by the spin unit 1. Then, by using the horizontal image photographed by the camera 2, the holding state of the substrate W in the spin unit 1, that is, whether or not the substrate W is appropriately held by the substrate holding members of the spin unit 1, is determined.

Specifically, while rotating the spin unit 1 at a low speed as described in step S12, the substrate W is consecutively photographed at a fixed frame rate by the camera 2 (step S13). In so doing, it is possible to acquire about 15 horizontal images during one rotation by setting the frame rate to 30 frames per second (fps) and by accelerating the spin unit 1 at 500 rpm/s from a stopped state, for example.

Next, in step S14, an image of a rotation start determination region is cut out from the first horizontal image, and this image is stored in the memory 4b as a rotation determination reference image. Then, an image of the rotation start determination region is cutout from the second horizontal image, and for every pixel constituting this image, an absolute value of a difference in density between a pixel and a pixel in the rotation determination reference image corresponding to the pixel is obtained, and an integrated value thereof is calculated. Furthermore, by dividing the integrated value by an area of the rotation start determination region, an average value of the density difference is calculated as a rotation determination value.

By the rotation determination value obtained this way becoming equal to or greater than a fixed reference value, it is possible to determine that the spin unit 1 has shifted from a stopped state to a rotating state. Furthermore, in this example, in a case where it is determined that the rotation determination value is equal to or greater than the reference value in step S15, it is determined that a rotation start is completed, and the process moves into an inspection step (step S16). On the other hand, in a case where the rotation determination value is smaller than the reference value, it is determined as a rotation stop. The process returns to the processing in S14 and continues with rotation determination of the third horizontal image and after.

In the next step S16, while continuing rotation of then spin unit 1, the substrate W is consecutively imaged at a fixed frame rate by the camera 2. Here, the frame rate is set to 30 fps, and 15 horizontal images are consecutively acquired while the substrate W makes one turn. Every time the horizontal image is acquired, an inspection region image is cut out from the horizontal image, and an average density value of the inspection region image is obtained. Furthermore, in step S17, a standard deviation of a density value of 15 inspection region images is obtained as a feature quantity indicating the holding state of the substrate W in the spin unit 1. It utilizes that the standard deviation of the density value of the inspection region images is greatly different depending on whether or not the substrate W is appropriately held. Note that the inspection region image that is cut out here is equivalent to a second image according to the present invention.

Then, in step S18, it is determined whether or not the standard deviation obtained in step S17 is within an accepted range. In a case where it is determined to be within the accepted range in step S18, the process moves into an original substrate processing such as a cleaning step (step S19). On the other hand, in a case where it is determined that the standard deviation exceeds the accepted range in step S18, the rotation of the spin unit 1 is immediately stopped, and it is displayed on the display unit 5 that there is abnormality in holding of the substrate W to inform the user thereof (step S20). Note that the CPU 4a that executes the processing in step S16 as described above is equivalent to a cut out unit according to the present invention. Furthermore, the CPU 4a that executes the processing in step S18 is equivalent to a determination unit according to the present invention.

Next, there is described a method for automatically determining a rotation start determination region and a rotation start determination threshold, which are used for determining the rotation start illustrated in FIG. 2, as well as a chuck abnormality determination region as the inspection region and a chuck abnormality determination threshold, which are used for determining the holding state of the substrate W. Note that in this example, it is assumed that automatic determination of the rotation start determination region, the rotation start determination threshold, the chuck abnormality determination region, and the chuck abnormality determination threshold is executed when a condition of the system is changed such as when the system is introduced and when a position of the camera 2 is changed, for example.

Figure 3:
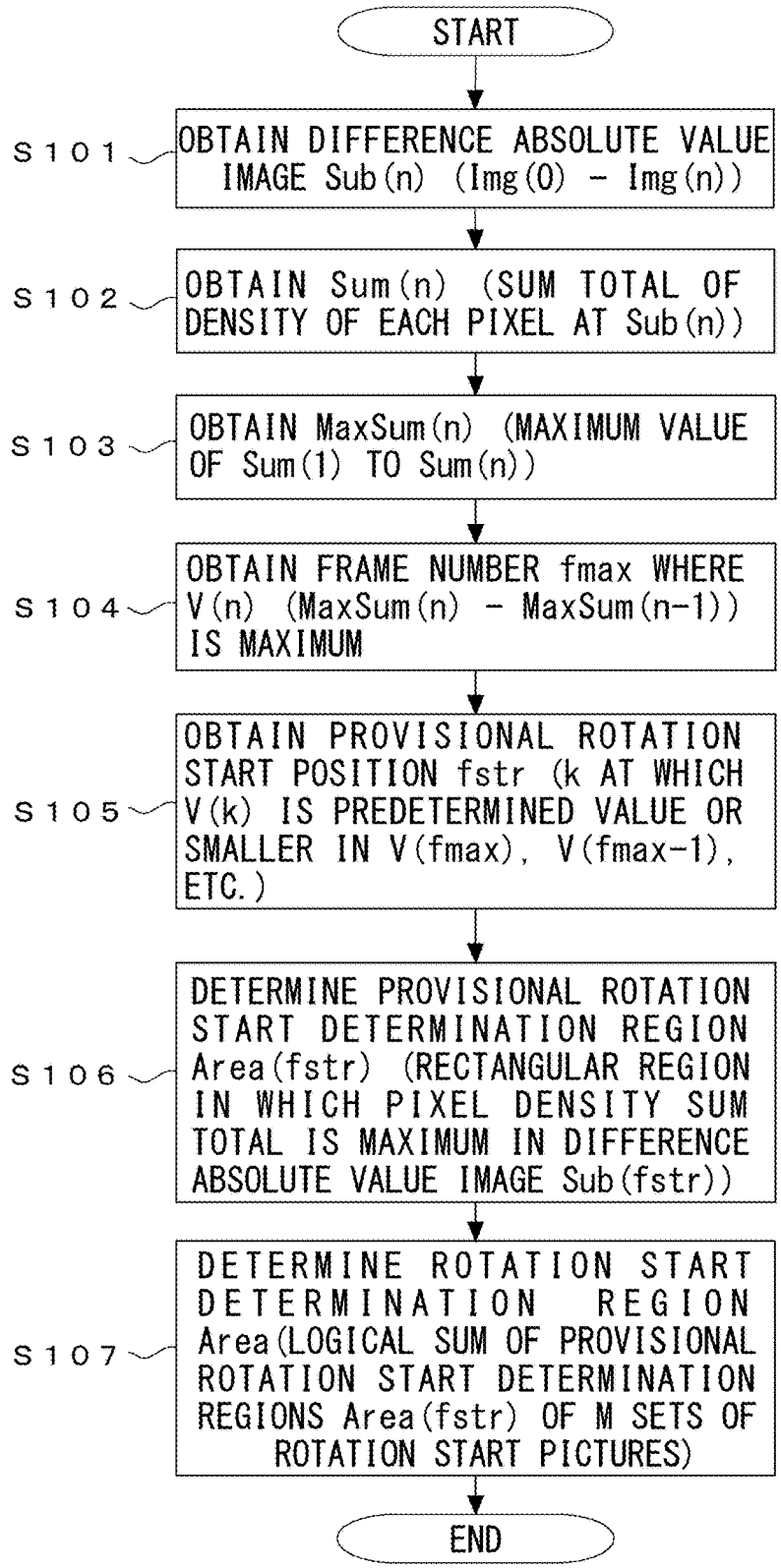
FIG. 3 is a flowchart illustrating a rotation start determination region determination routine according to the example of the present invention.

In FIG. 3, a flowchart of a rotation start determination region determination routine according to this example is illustrated. This routine is also a program executed by the CPU 4a of the system main body control unit 4 and is stored in the memory 4b.

When this routine is executed, first, in step S101, a picture of a process in which the spin unit 1 in a still state starts rotation is photographed by the camera 2. A condition in so doing may be the same as the photographing condition described in FIG. 2 in which the frame rate is set to 30 fps and the spin unit 1 is accelerated at 500 rpm/s from the stopped state, whereby about 15 horizontal images are acquired during one rotation.

Then, there is generated a difference absolute value image Sub(n) that is an image illustrating an absolute value of a density difference of each pixel between a frame image Img(0) in an initial state, and an n-th frame image Img(n) among the plurality of frame images constituting the acquired picture. When processing in step S101 is completed, the routine proceeds to step S102.

In step S102, there is obtained Sum(n) that is a sum total of density of each pixel in the difference absolute value image Sub(n) that has been generated in step S101. Here, a relationship between the frame image Img(0) in the initial state, the n-th frame image Img(n), the difference absolute value image Sub(n), and the sum total Sum(n) of the density of each of the pixels is as the following formula (1).

$$\text{Sum}(n) = \Sigma |\text{Img}(n) - \text{Img}(0)| = \Sigma \text{Sub}(n) \quad (1)$$

When processing in step S102 is completed, the routine proceeds to step S103.

Figure 4:
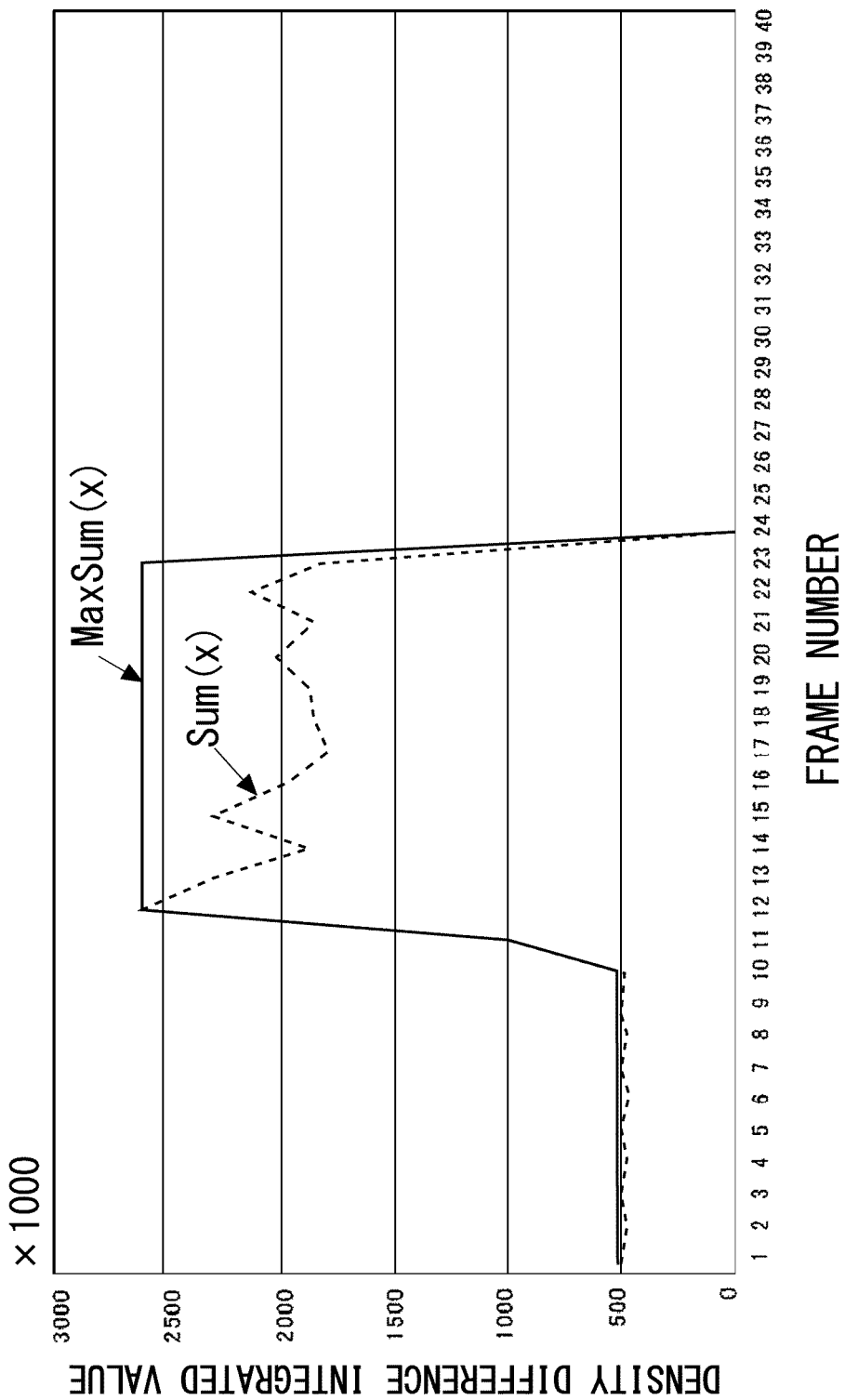
FIG. 4 is a graph for describing a concept of MaxSum(n) according to the example of the present invention.

In step S103, there is obtained MaxSum(n) that is the maximum value of Sum(1) to Sum(n) that has been obtained in step S102. In FIG. 4, a graph for describing a concept of MaxSum(n) is illustrated. In FIG. 4, a frame number of each of the frame images is indicated on a horizontal axis. The density difference integrated value Sum(n) of each of the frame images is indicated on a vertical axis. As it is evident from FIG. 4, in this example, Sum(n) of a frame 12 is the maximum, whereby Sum(n) of the frame 12 is the MaxSum(n). When processing in step S103 is completed, the routine proceeds to step S104.

In step S104, by further performing arithmetic of a formula (2) below for each MaxSum(n), an increment V(n) of the MaxSum(n) is obtained, and furthermore, a frame number fmax having the maximum V(n) is obtained.

$$V(n) = \text{MaxSum}(n) - \text{MaxSum}(n-1) \quad (2)$$

Figure 5:
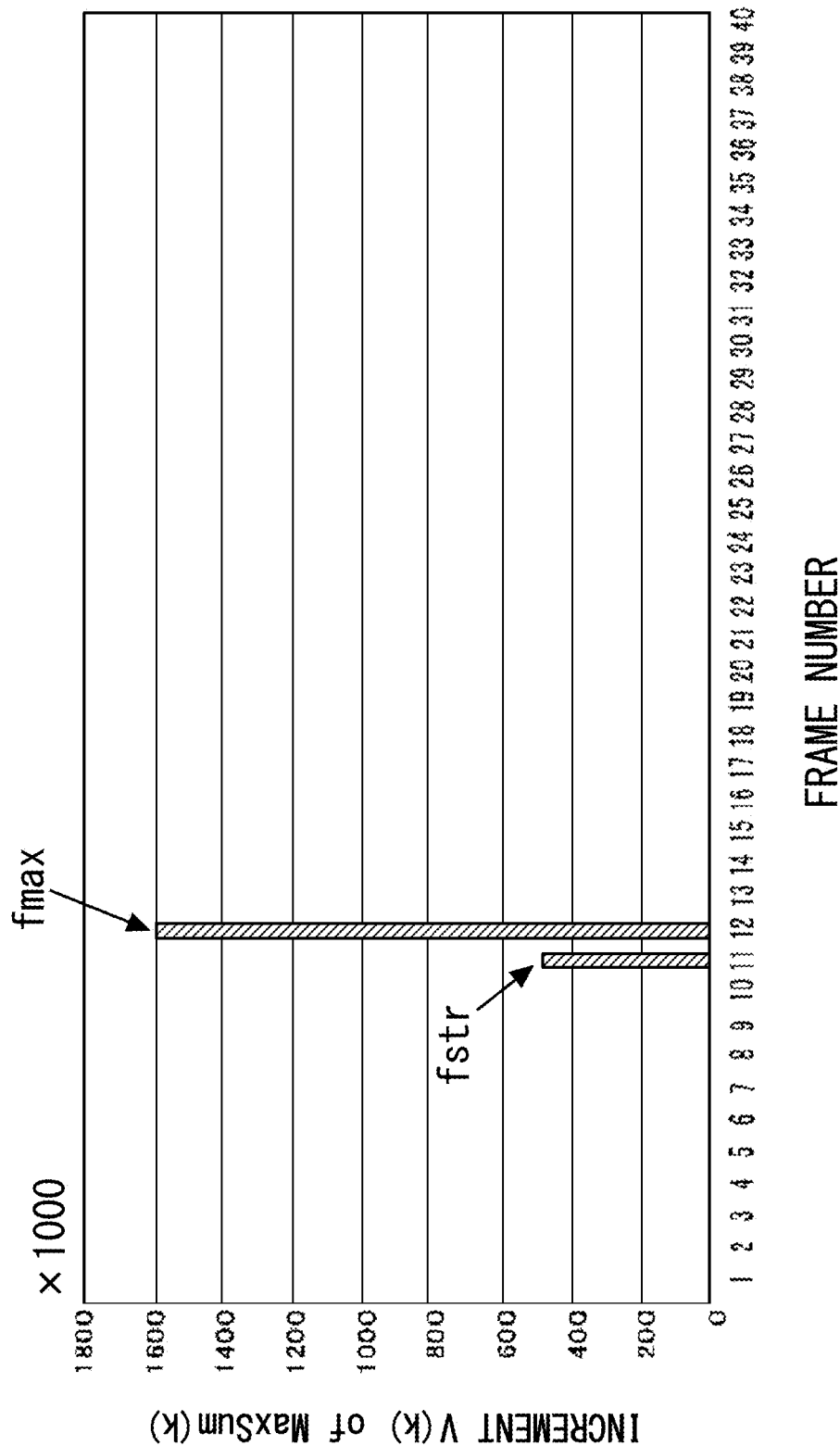
FIG. 5 is a graph illustrating MaxSum(n) according to the example of the present invention in which a frame number is indicated on a horizontal axis and V(n) of each frame is indicated on a vertical axis.

In FIG. 5, related to the example of the MaxSum(n) illustrated in FIG. 4, a graph is illustrated in which the frame number is indicated a horizontal axis and V(n) of each frame is indicated on a vertical axis. In the example in FIG. 5, it is evident that fmax is 12. When processing in step S104 is completed, the routine proceeds to step S105.

In step S105, for the frame image having a smaller frame number than fmax, which has been obtained in step S104, V(k) is obtained such as V(fmax), V(fmax−1), V(fmax−2), and so on, and k is obtained such that V(k) is equal to or smaller than a predetermined value. Then, k at that time is referred to as a provisional rotation start position fstr. In this example, the predetermined value is set to 700 (×1000), and fstr is set to 11. In this example, to enable detection of the rotation start at an earliest possible stage after the rotation start, there is obtained fstr that is the frame number in a state where the increment V(n) of the MaxSum(n) is not very large after the rotation start. As the predetermined value, it is preferred that a value that suits a purpose thereof be set in advance. When processing in step S105 is completed, the routine proceeds to step S106. Note that here, the predetermined value 700 (×1000) is equivalent to a third threshold according to the present invention.

Figure 6:
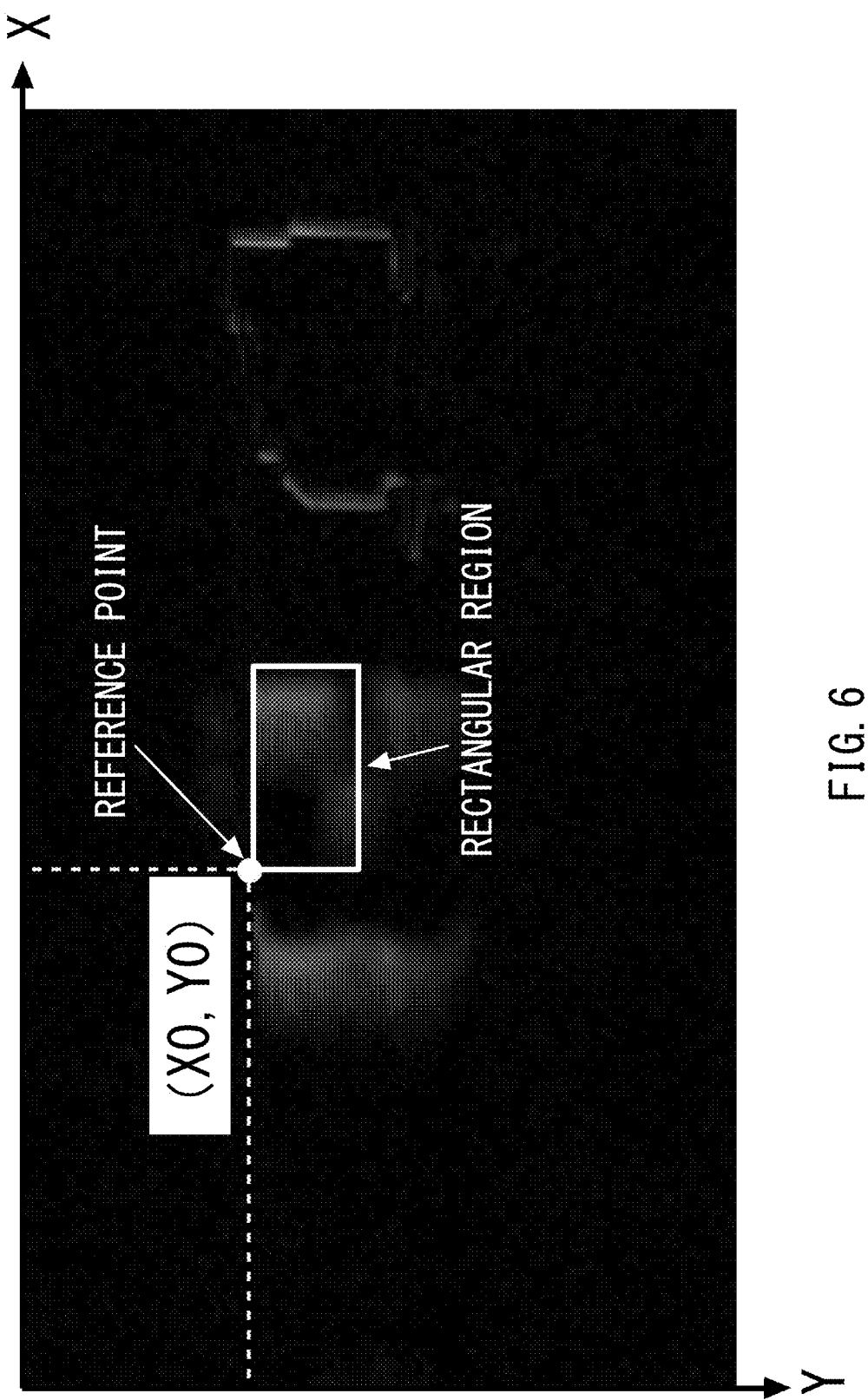
FIG. 6 is a graph for describing a provisional rotation start determination region according to the example of the present invention.

In step S106, by using a difference absolute value image Sub(fstr) at the provisional rotation start position fstr (=11), a provisional rotation start determination region is determined. More specifically, by calling an image of Sub(11), as illustrated in FIG. 6, within a rectangular region having a width w and a height h, a point that is the closest to an origin within the region is defined as a reference point (x0, y0). Then, by changing this reference point (x0, y0), the whole image of the Sub(11) is scanned with the rectangular region to obtain the reference point (x0, y0) at which a pixel density sum total of the rectangular region is the maximum. Note that at that time, it is preferred that the pixel density sum total/area of the rectangular region (=average density variation value CutSum(x0, y0)) be derived for each of the reference points (x0, y0). Then, the rectangular region having the reference point (x0, y0) that is a point at which the pixel density sum total of the rectangular region is the maximum is set as a provisional rotation start determination region Area(11). When processing in step S106 is completed, the routine proceeds to step S107. Note that the average density variation value is a value obtained by dividing the pixel density sum total by the area of the rectangular region as described above; however, since the area of the rectangular region is a fixed value, it is handled here in as a physical quantity actually having meaning equivalent to the pixel density sum total of the rectangular region or an integrated value of pixel density of the rectangle region.

In step S107, a determination step of a provisional rotation start determination region Area(k) described above is repeated M times (M=3 in this example). A logical sum of all of the provisional rotation start determination regions Area(k), which have been obtained in each of the determination steps, is obtained and is set as a rotation start determination region Area. When processing in step S107 is completed, this routine is temporarily ended. In this routine, the rotation start determination region Area has been automatically determined.

Figure 7:
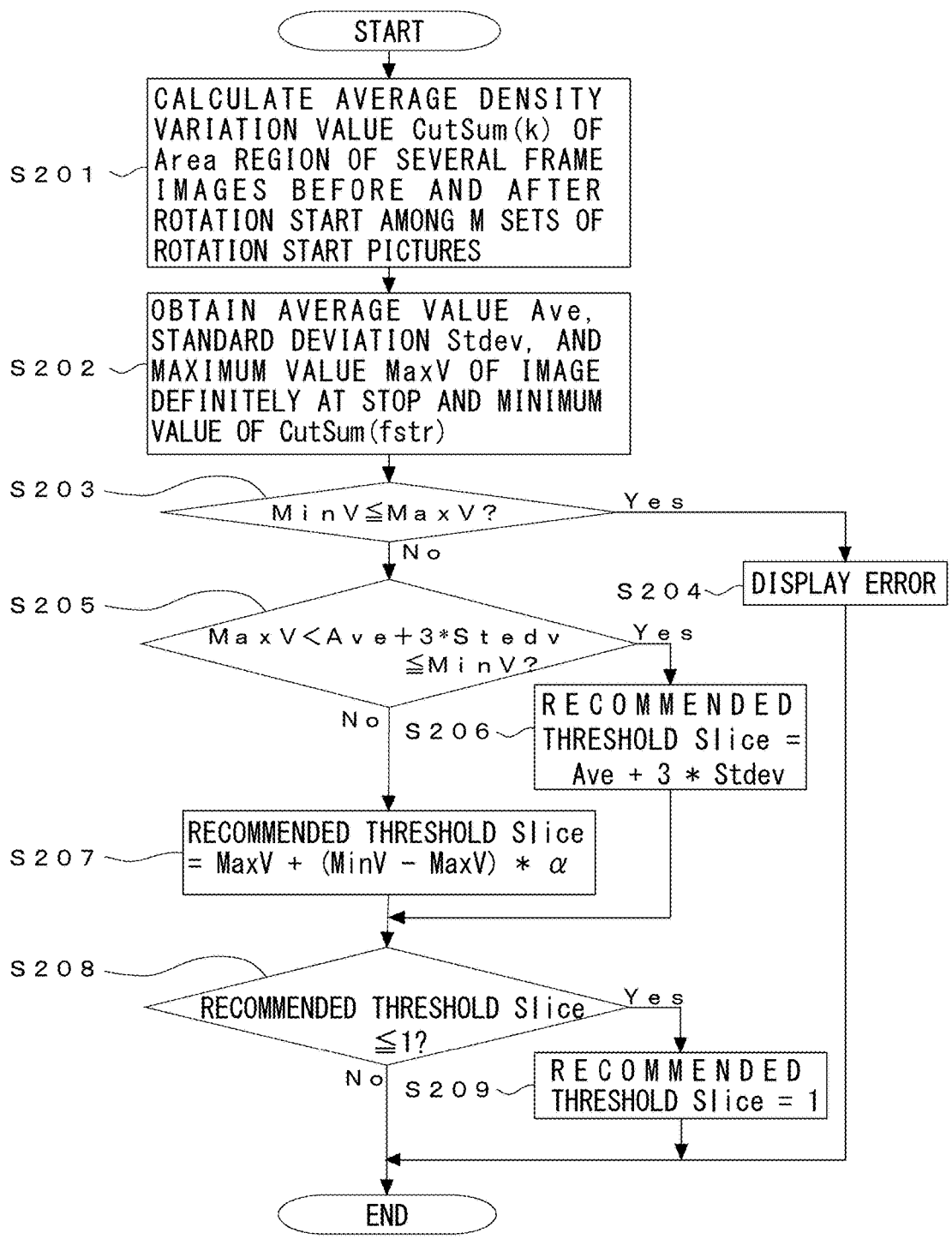
FIG. 7 is a flowchart illustrating a rotation start determination threshold determination routine according to the example of the present invention.

Next, automatic calculation of the rotation start determination threshold is performed. In FIG. 7, a flowchart of a rotation start determination threshold determination routine according to this example is illustrated. This routine is also a program executed by the CPU 4a of the system main body control unit 4 and is stored in the memory 4b. As described in step S107 of the rotation start determination region determination routine, in this example, the processing in steps S101 to S106 is repeated M times, and it is assumed that the picture of the spin unit 1 that starts rotation from the stopped state is photographed by the camera 2 M times (M=3 in this example).

Then, when this routine is executed, first, in step S201, from among the M sets of pictures (M=3 in this example) of the spin unit 1 that starts the rotation from the stopped state, the rotation start determination region Area is cut out from images of several frames before and after the rotation start of the spin unit 1, and an average density variation value CutSum(k) is obtained. A result thereof is exemplified in a table in FIG. 8. In FIG. 8, the frame image at the provisional rotation start position fstr has an offset of zero, the frame image before fstr has an offset of a negative number, and the frame image after fstr has an offset of a positive number.

Here, for the frame image having the offset from the provisional rotation start position fstr of −12 to −2, the average density variation value CutSum(k) is clearly a small value, whereby it is considered that the spin unit 1 is definitely at a stop. For the frame image having the offset from the provisional rotation start position fstr of −2 to −1, there is data indicating that the average density variation value CutSum(k) is increasing, whereby it is a gray area whether or not the spin unit 1 is at a stop or is rotating. Furthermore, for the frame image having the offset from the provisional rotation start position fstr of 0 to 4, the average density variation value CutSum(k) is clearly a large value or is increasing, whereby it is considered that the spin unit 1 is definitely rotating. When processing in step S201 is completed, the routine proceeds to step S202.

In step S202, for CutSum(k) of the region having the offset of −12 to −2 and is definitely at a stop, an average value Ave, a standard deviation Stdev, and a maximum value MaxV are obtained. Furthermore, a minimum value MinV of CutSum(fstr) of three measurements illustrated in FIG. 8 is obtained. When processing in step S202 is completed, the routine proceeds to step S203.

In step S203, the maximum value MaxV of CutSum(k) of the region, which is definitely at a stop, obtained in step S202 is compared with the minimum value MinV of CutSum(fstr) in magnitude. In a case where it is MinV MaxV, it is not possible to set a threshold, whereby the routine proceeds to step S204. Then, an error display is performed in step S204, and this routine is temporarily ended. Here, a density change, stray light, reflected glare of an unnecessary image, large noise, and the like are considered as a factor causing such error. On the other hand, in step S203, in a case where it is determined as MinV>MaxV, the routine proceeds to step S205.

In step S205, it is determined whether or not a formula (3) described below is satisfied.

$$MaxV < Ave + 3*Stdev \leq MinV \quad (3)$$

Then, in a case where it is determined that the formula (3) is satisfied in step S205, the routine proceeds to step S206. On the other hand, in a case where it is determined that the formula (3) is not satisfied in step S205, the routine proceeds to step S207.

In step S206, a recommended threshold Slice is set to Ave+3*Stdev. Accordingly, it is possible to obtain the recommended threshold Slice that is larger than a substantially maximum value of variation of CutSum(k) in a case where the spin unit 1 is at a stop. When processing in step S206 is completed, the routine proceeds to step S208.

In step S207, the formula (4) described below is satisfied.

$$MinV < Ave + 3*Stdev \quad (4)$$

In this case, the recommended threshold Slice is set to MaxV+(MinV−MaxV)*α(0<α<1). Accordingly, it is possible to obtain the recommended threshold Slice existing between MaxV and MinV. When processing in step S207 is completed, the routine proceeds to step S208.

In step S208, it is determined whether or not the recommended threshold Slice that has been set in step S206 or step S207 is equal to or smaller than one. Here, in a case where it is determined that the recommended threshold Slice is equal to or smaller than one, the routine proceeds to step S209, and the recommended threshold Slice is compulsorily set to one. When processing in step S209 is completed, this routine is temporarily ended. In a case where it is determined that the recommended threshold Slice is larger than one in step S208, this routine is temporarily ended as it is.

As above, by executing the rotation start determination threshold determination routine, it is possible to automatically determine the recommended threshold Slice, which is correspond to a second threshold according to the present invention.

Next, in this example, further improving accuracy of the frame number at the time of the rotation start is reconsidered by using FIG. 8. The provisional rotation start position fstr obtained in step S105 has been obtained based on a difference absolute value image of the whole frame image. On the other hand, in FIG. 8, the average density variation value CutSum(k) has been obtained for the rotation start determination region Area in which it is possible to more accurately evaluate the time of the rotation start, whereby a rotation start position fstr2 having higher accuracy is obtained by using FIG. 8.

Figure 9:
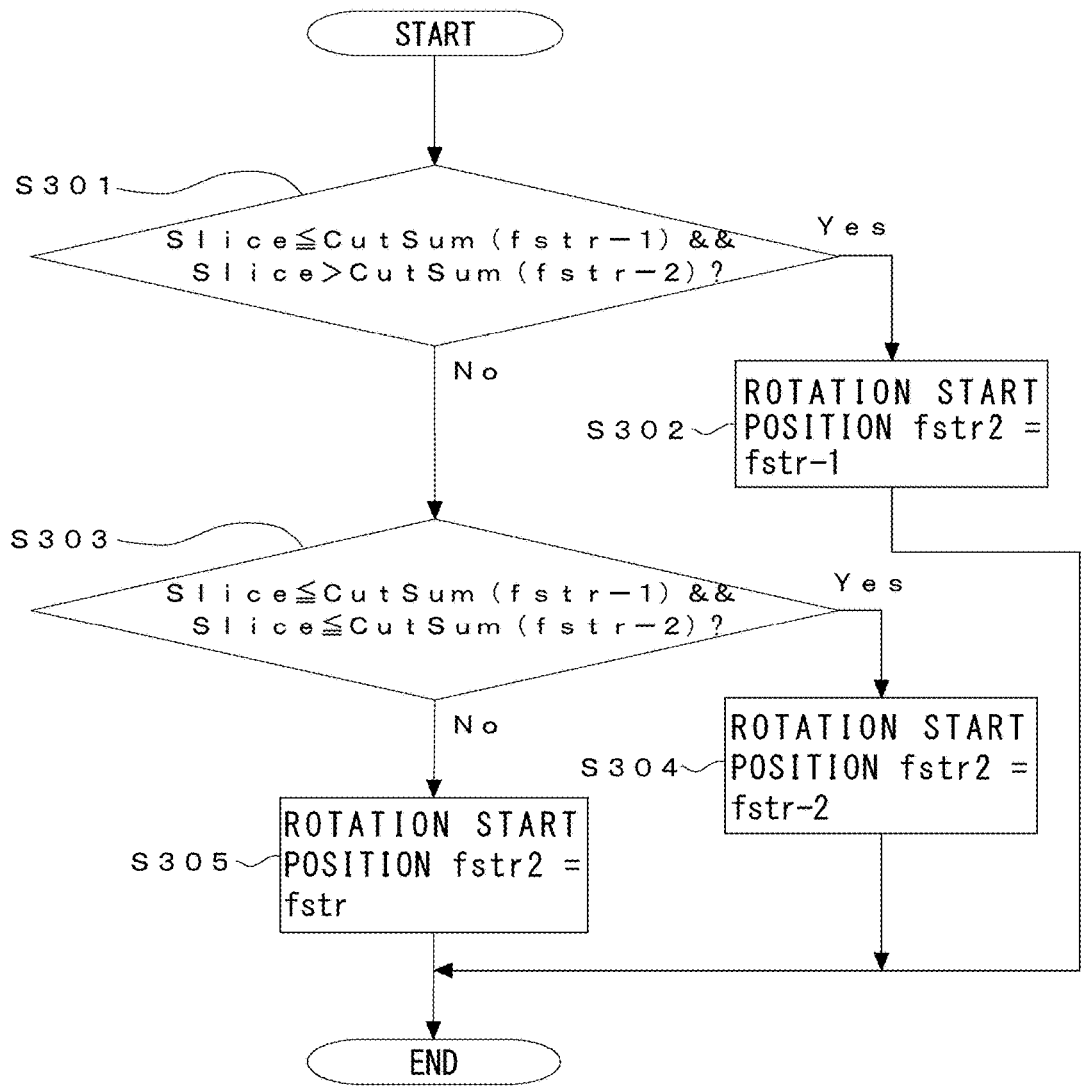
FIG. 9 is a flowchart illustrating a rotation start position determination routine according to the example of the present invention.

In FIG. 9, a flowchart of a rotation start position determination routine according to this example is illustrated. This routine is also a program executed by the CPU 4a of the system main body control unit 4 and is stored in the memory 4b.

When this routine is executed, first, in step S301, it is determined whether or not both of the following formulas (5) and (6) are satisfied for the recommended threshold Slice that has been determined in the rotation start determination threshold determination routine.

$$Slice \leq CutSum(fstr-1) \quad (5)$$

$$Slice > CutSum(fstr-2) \quad (6)$$

Then, in a case where it is determined that both of the formulas (5) and (6) are satisfied, the routine proceeds to step S302. On the other hand, in a case where it is determined that at least one of the formulas (5) and (6) are not satisfied, the routine proceeds to step S303.

In step S302, it is determined that the rotation start position fstr2=fstr−1. When processing in S302 is completed, this routine is temporarily ended.

In step S303, it is determined whether or not both of the following formulas (7) and (8) are satisfied for the recommended threshold Slice that has been determined in the rotation start determination threshold determination routine.

$$Slice \leq CutSum(fstr-1) \quad (7)$$

$$Slice \leq CutSum(fstr-2) \quad (8)$$

Then, in a case where it is determined that both of the formulas (7) and (8) are satisfied, the routine proceeds to step S304. On the other hand, in a case where it is determined that at least one of the formulas (7) and (8) are not satisfied, the routine proceeds to step S305.

In step S304, it is determined that the rotation start position fstr2=fstr−2. When processing in step S304 is completed, this routine is temporarily ended. In step S305, it is determined that the rotation start position fstr2=fstr. When processing in step S304 is completed, this routine is temporarily ended.

As above, it is possible to determine the rotation start position fstr2 having the higher accuracy.

Figure 10:
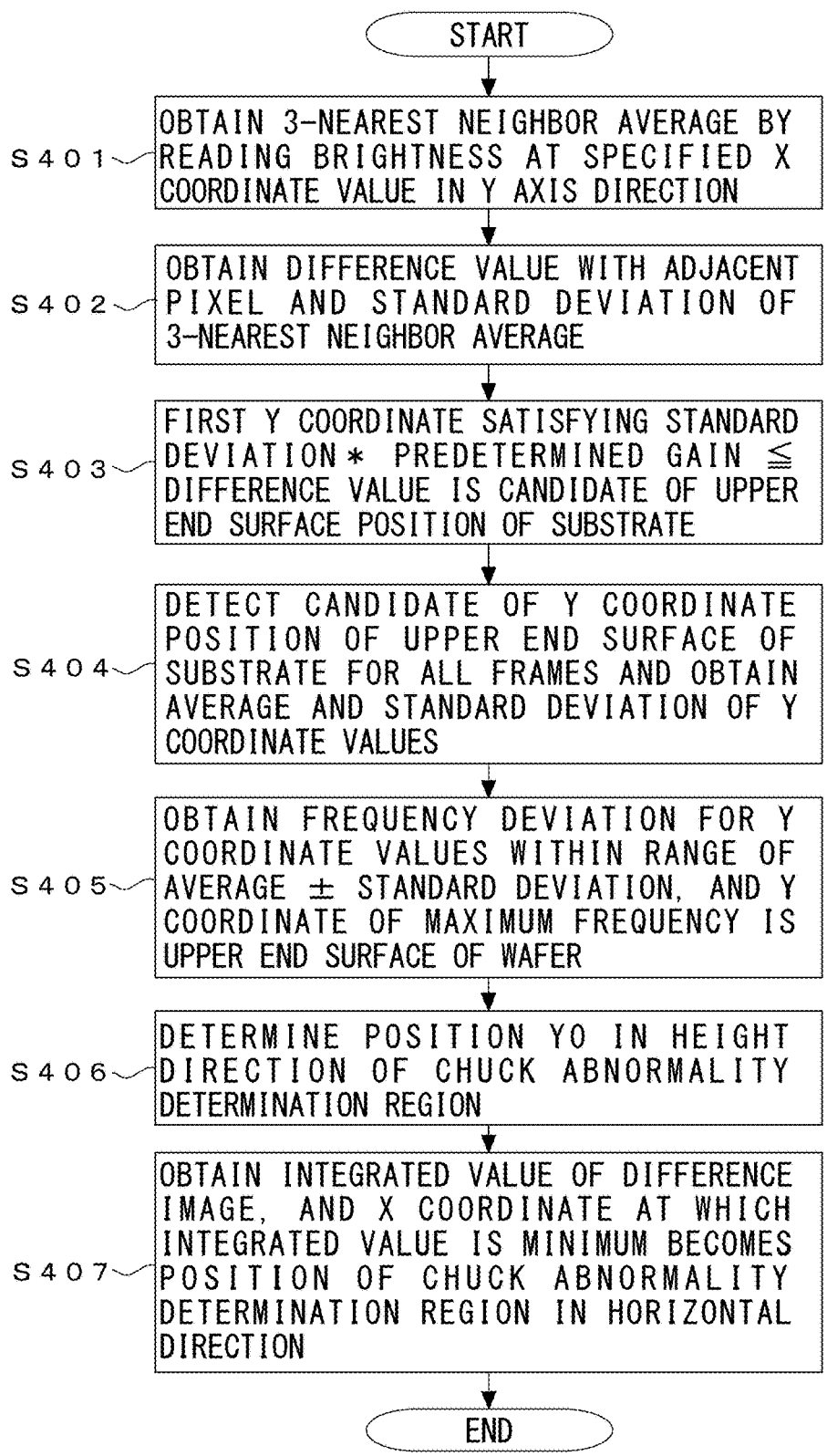
FIG. 10 is a flowchart illustrating a chuck abnormality determination region determination routine according to the example of the present invention.

Next, automatic determination of the chuck abnormality determination region is described. In FIG. 10, a flowchart of a chuck abnormality determination region determination routine is illustrated. This routine is also a program executed by the CPU 4a of the system main body control unit 4 and is stored in the memory 4b. This routine is a routine that performs (1) detection of an upper end surface of a wafer for a plurality of places in one frame image, (2) determination of a position of the upper end surface of the wafer, and (3) determination of the chuck abnormality determination region. That is, in this routine, several search start points (X, 0) for searching a wafer edge are provided, and a Y coordinate of the upper end surface of the wafer at each of the points with a different X coordinate is detected. For example, in the frame image, each of the X coordinates of the search start points may be set at an interval of 20 pixels in a range of an image width*(0.2 to 0.8).

Figure 11:
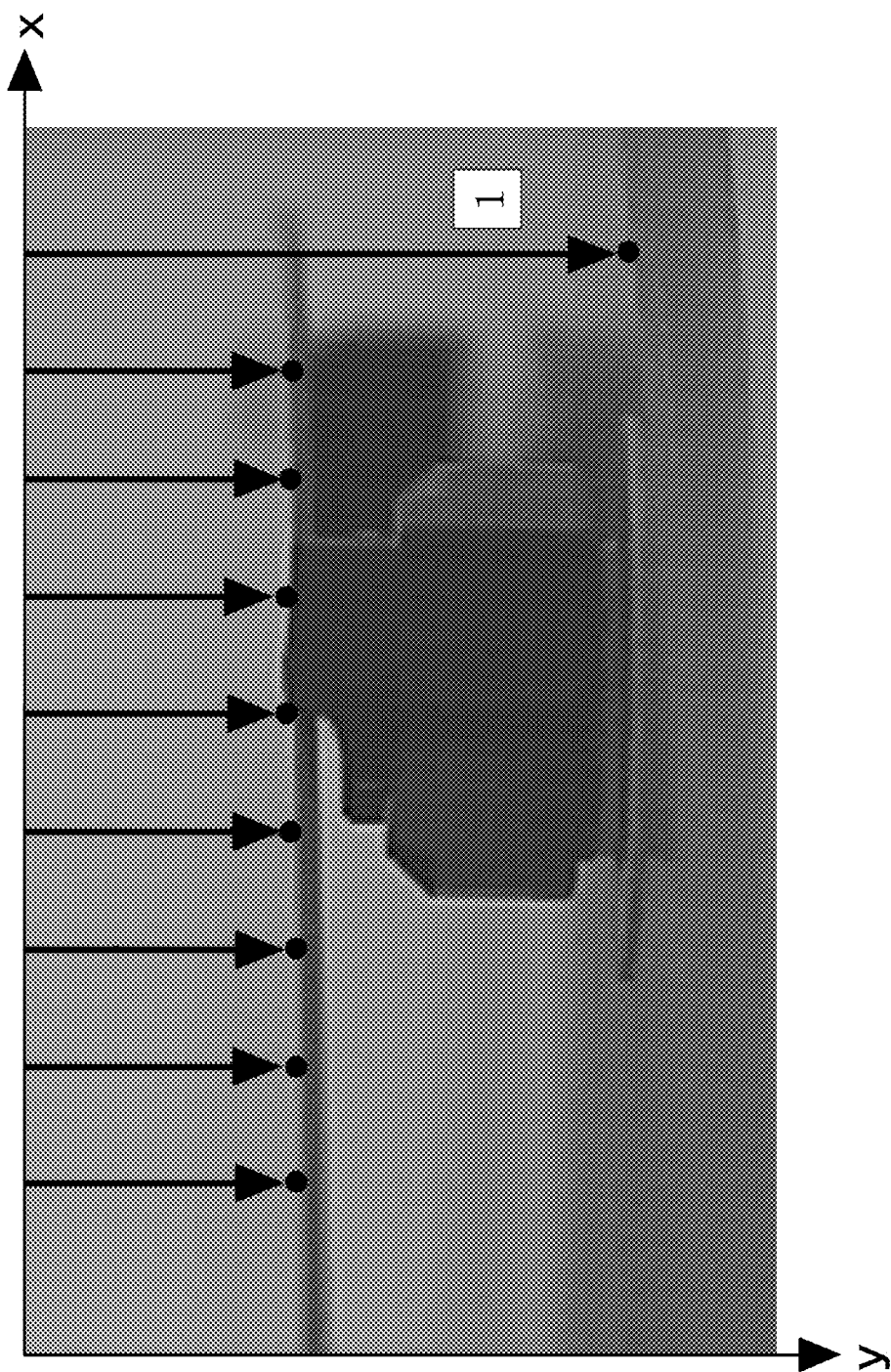
FIG. 11 is a graph for describing algorithm for detecting an upper end surface of a substrate according to the example of the present invention.

When this routine is executed, first, in step S401, in an image of a wafer that is at a stop as illustrated in FIG. 11, to obtain the upper end surface of the wafer edge, density of each pixel is read in an Y axial direction from each of the search start points (X(m), 0), and a 3-nearest neighbor average is obtained. When processing in step S401 is completed, the routine proceeds to step S402.

In step S402, a difference value between the 3-nearest neighbor average of each of the pixels and a 3-nearest neighbor average of an adjacent pixel as well as a standard deviation of the 3-nearest neighbor average of each of the pixels are obtained. When processing in step S402 is completed, the routine proceeds to step S403.

In step S403, a first Y coordinate value at which the above-described standard deviation*predetermined gain (2.5 in this example) difference value is satisfied becomes a candidate of the upper end surface of the wafer. When processing in step S403 is completed, the routine proceeds to step S404. Here, the predetermined gain (2.5) is equivalent to a predetermined multiple according to the present invention.

In step S404, the Y coordinate of the above-described candidate of the upper end surface of the wafer is obtained for all X(m) of the frame image. Then, an average and a standard deviation of the Y coordinate values of the candidate of the upper end surface of the wafer are obtained. When processing in step S404 is completed, the routine proceeds to step S405.

Figure 12A:
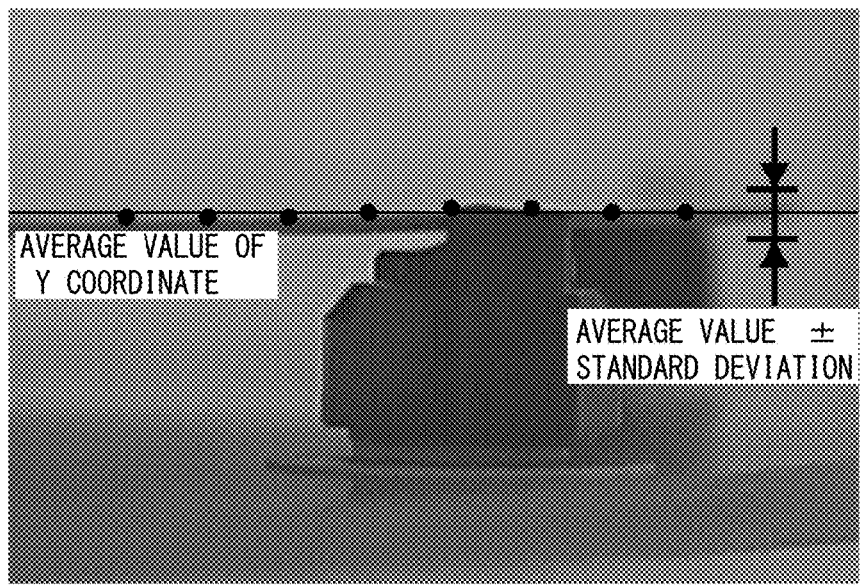
FIGS. 12A and 12B are second graphs for describing the algorithm for detecting the upper end surface of the substrate according to the example of the present invention.

In step S405, from the average and the standard deviation of the Y coordinate values of the candidate of the upper end surface of the wafer that have been obtained in step S404, an average±standard deviation is calculated. Then, among the Y coordinates of the candidate of the upper end surface of the wafer obtained for all X(m) of the frame image, there is calculated a frequency distribution of data within a range of the average±standard deviation. In FIG. 12A, the range of the average±standard deviation that has been obtained from the average and the standard deviation of the Y coordinate values of the candidate of the upper end surface of the wafer is illustrated.

Figure 12B:
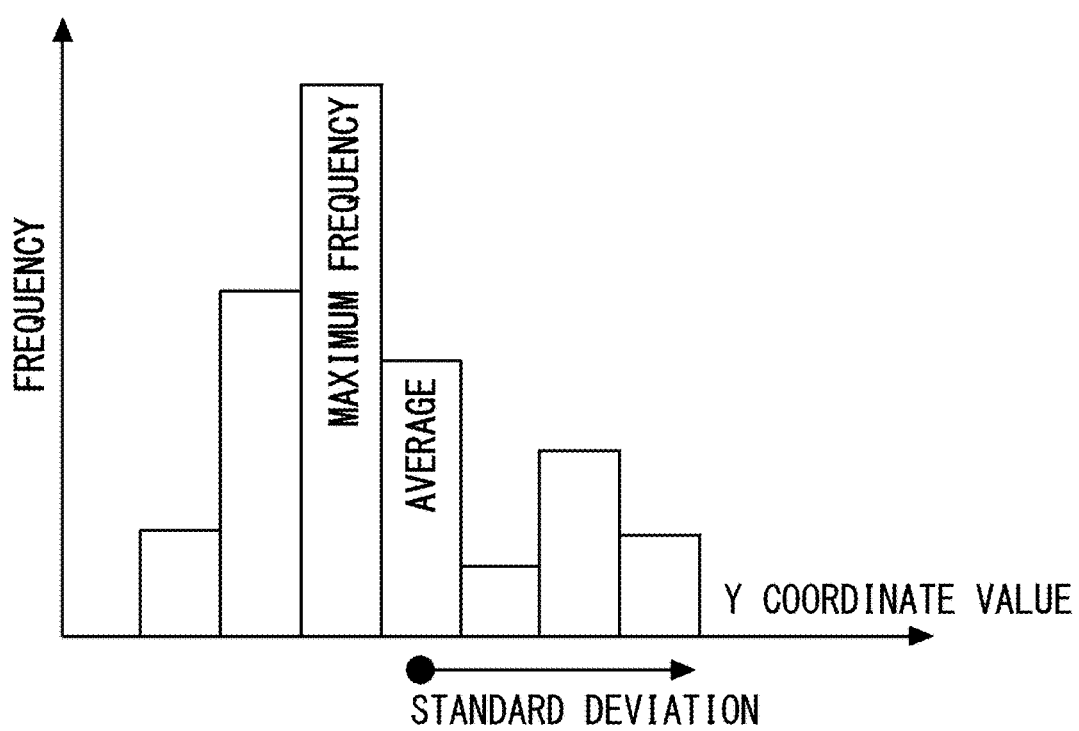

In FIG. 12B, among the Y coordinates of the candidate of the upper end surface of the wafer obtained for all X(m) of the frame image, there is illustrated an exemplary frequency distribution of the data within the range of the average±standard deviation. Then, in the frequency distribution of FIG. 12B, a Y coordinate value of a point where a frequency is the maximum becomes the Y coordinate of the upper end surface of the wafer. Note that a singular point such as a point "1" illustrated in FIG. 11 is excluded by selecting only the Y coordinate within the range of the average±standard deviation as illustrated in FIG. 12A, whereby according to a method of this example, it is possible to obtain the Y coordinate of the upper end surface of the wafer with higher accuracy. When processing in step S405 is completed, the routine proceeds to step S406. Note that in the processing in steps S401 to S402, the 3-nearest neighbor average of each of the pixels is obtained, it has been focused on the difference value with the 3-nearest neighbor average of the adjacent pixel; however, in the present invention, it is not always necessary to obtain the 3-nearest neighbor average of each of the pixels. It is also possible to absorb variation of each of the pixels using a different method. In addition, it is not always necessary to use one pixel as a unit of detection and comparison of density. For example, it is also possible to obtain an average of density of every two pixels and to obtain a difference value with an average of density of adjacent two pixels. In this case, every two pixels are handled as one pixel.

In processing after step S406, the chuck abnormality determination region is determined. As an assumption of the processing in step S406, as illustrated in FIG. 13, a width and a height of the chuck abnormality determination region and a gap amount thereof from the upper end surface of the wafer are determined in advance as parameters. Furthermore, by the time when the processing in step S406 is executed, the Y coordinate of the upper end surface of the wafer has been determined, whereby Y0, which is a coordinate in a height direction of the chuck abnormality determination region is determined based on the Y coordinate of the upper end surface of the wafer and the gap amount of the chuck abnormality determination region from the upper end surface of the wafer. When processing in step S406 is completed, the routine proceeds to step S407.

Figure 14A:
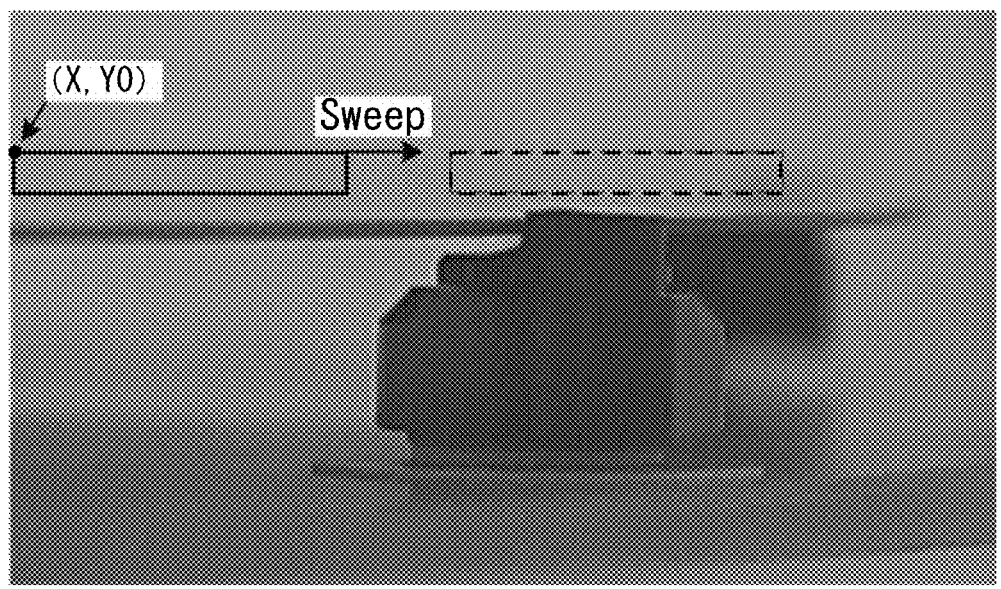
FIGS. 14A and 14B are graphs for describing algorithm for determining the chuck abnormality determination region according to the example of the present invention.
Figure 14B:
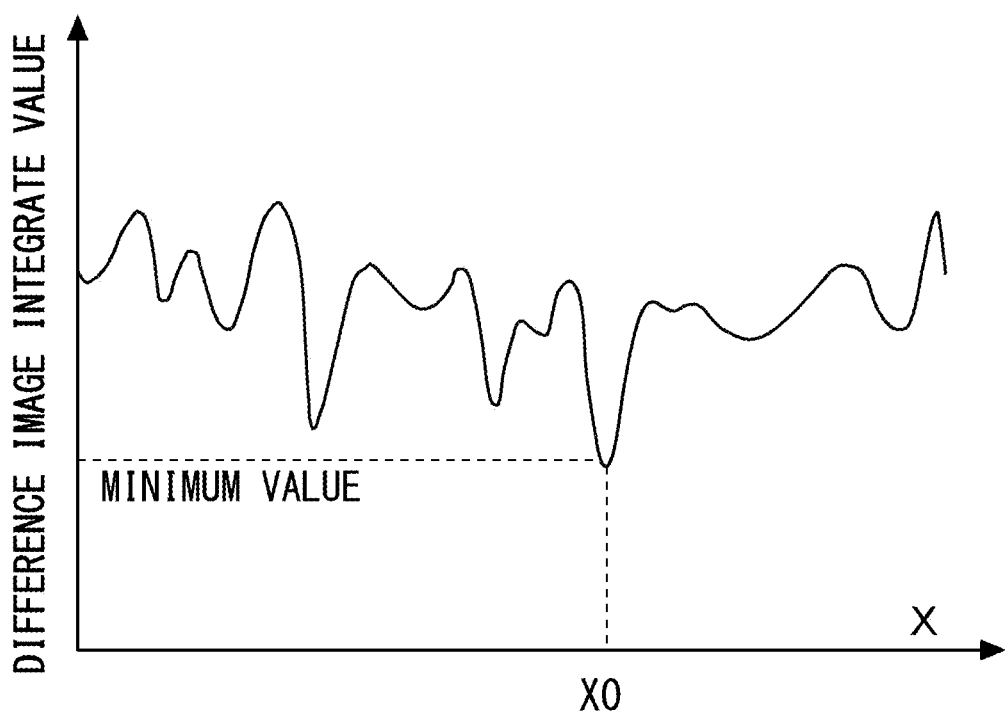

In step S407, an X coordinate of a reference point for the chuck abnormality determination region is obtained. As for the X coordinate of the chuck abnormality determination region, in the same way as calculation for obtaining the rotation start determination region, by changing the X coordinate as illustrated in FIG. 14A, a position at which the pixel density sum total of the rectangular region in the difference absolute value image is the minimum (hereinafter, also referred to as a difference image integrated value) is set as a reference X coordinate of the chuck abnormality determination region. Accordingly, it is possible to set a region in which there is no shadow of the substrate holding member and the like in the background as the chuck abnormality determination region, whereby it is possible to reduce a probability of false report in a normal state and to improve detection accuracy of chuck abnormality. When processing in step S407 is completed, this routine is temporarily ended. Note that the difference absolute value image in step S407 may be an image illustrating an absolute value of a density difference of each of the pixels between the rectangular region in the frame image in the initial state and the rectangular region in the frame image at the rotation start time, but is not limited to this. It may also be an image illustrating the absolute value of the density difference of each of the pixels between the rectangular region in the frame image in the initial state and the rectangular region in the frame image at a predetermined time before or after the rotation start. Furthermore, not limited to the above, it may also be an image illustrating the absolute value of the density difference of each of the pixels between the rectangular regions in two frame images at two different points of time. In addition, it may also be an image illustrating the absolute value of the density difference of each of the pixels between the rectangular region at a coordinate (x, y0) and the rectangular region at a position at which the X coordinate is changed, for example, in the frame image at the same point of time.

Here, the CPU 4*a* that executes the above-described chuck abnormality determination region determination routine is equivalent to an inspection region determination unit according to the present invention. Furthermore, the processing in S401 to S405 is equivalent to an upper end surface confirming step according to the present invention, and the CPU 4*a* that executes the processing in S401 to S405 is equivalent to an upper end surface confirmation unit according to the present invention. The processing in S406 is equivalent to a vertical position determination step according to the present invention, and the CPU 4*a* that executes the processing in S406 is equivalent to a vertical position determination unit according to the present invention. The processing in S407 is equivalent to a horizontal position determination step according to the present invention, and the CPU 4*a* that executes the processing in S407 is equivalent to a horizontal position determination unit according to the present invention.

Figure 15:
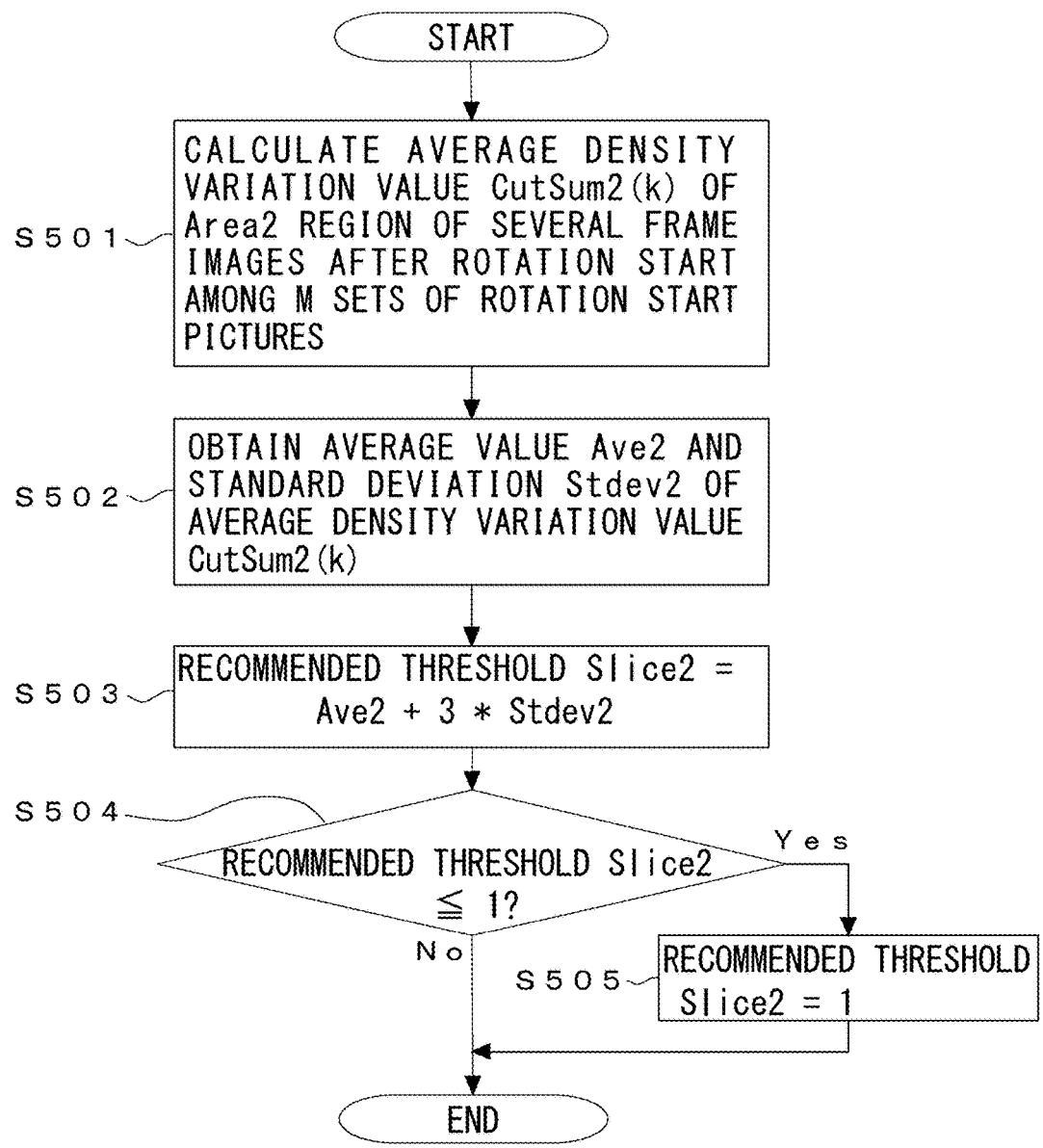
FIG. 15 is a flowchart illustrating a chuck abnormality determination threshold determination routine according to the example of the present invention.
Figure 16:
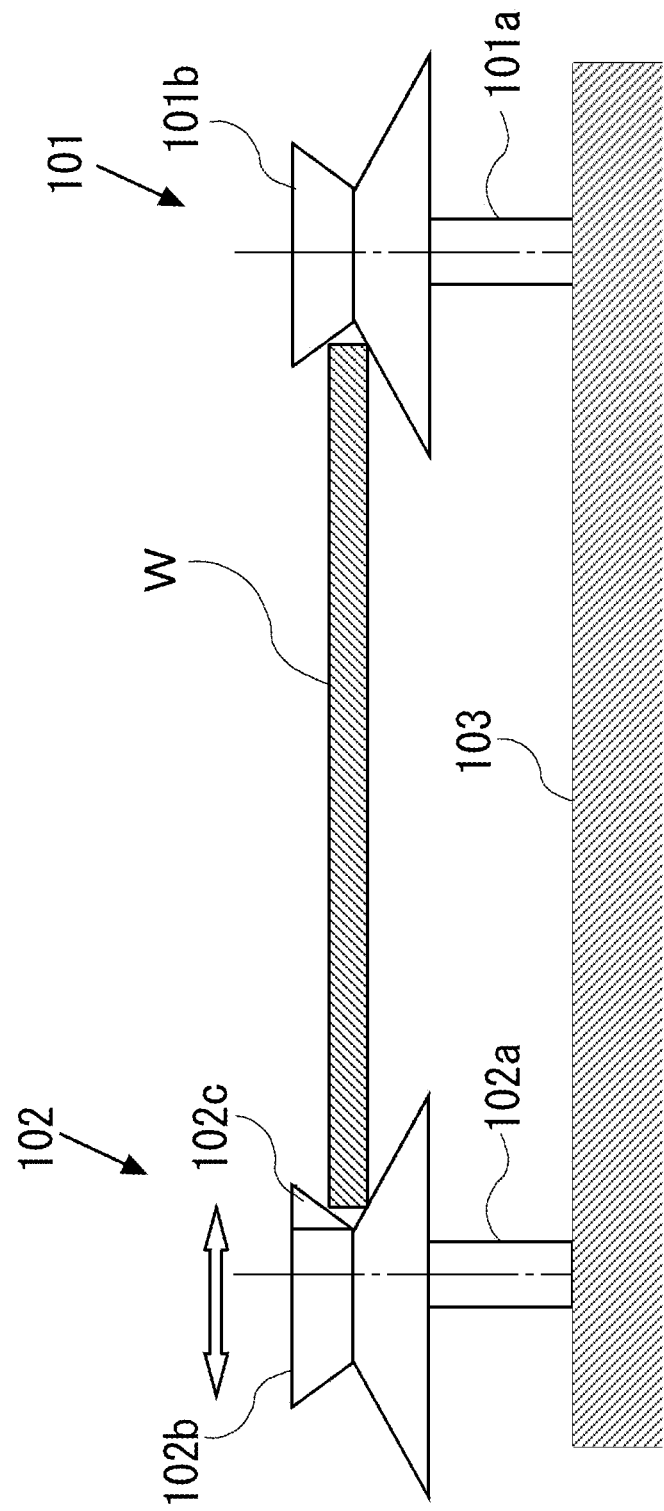
FIG. 16 is a view illustrating a basic configuration of a conventional substrate holding unit.
Figure 17:
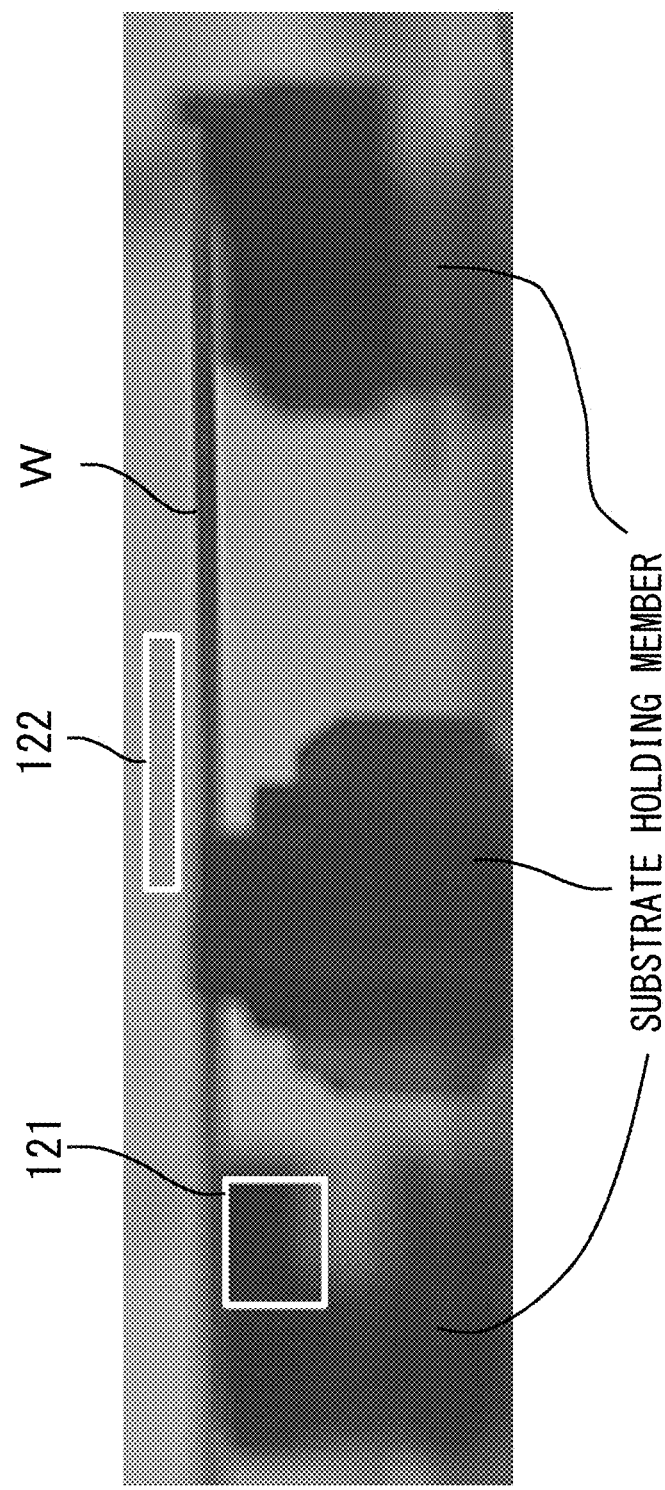
FIG. 17 is a view for describing the rotation start determination region and the chuck abnormality determination region.

Next, automatic calculation of a threshold for determining the chuck abnormality is described. In FIG. 15, a flowchart of a chuck abnormality determination threshold determination routine is illustrated. This routine is also a program executed by the CPU 4*a* of the system main body control unit 4 and is stored in the memory 4*b*.

When this routine is executed, first, in step S501, by using the substrate W that is normally chucked to the spin unit 1, a chuck abnormality determination region Area 2 is cut out from an image of several frames after the rotation start among all pictures in which the picture of the spin unit 1 in a process of starting the rotation is photographed by the camera 2 M times (M=3 in this example), and a pixel density sum total/Area (=average density variation value CutSum2 (k)) is obtained. Here, illustration of a table listing a detection value of the average density variation value CutSum2 (k) for each of the frame images is omitted. When processing in step S501 is completed, the routine proceeds to step S502.

In step S502, for the average density variation value CutSum2 (k) of the chuck abnormality determination region Area 2 in a period when it is definitely rotating, an average value Ave2, a standard deviation Stdev2, and a maximum value MaxV2 are obtained. When processing of step S502 is completed, the routine proceeds to step S503.

In step S503, a recommended threshold Slice2 is set to Ave2+3*Stdev 2. When processing in step S503 is completed, the routine proceeds to step S504.

In step S504, it is determined whether or not the recommended threshold Slice2 that has been set in step S503 is equal to or smaller than one. Here, in a case where it is determined that the recommended threshold Slice2 is equal to or smaller than one, the routine proceeds to step S505, and the recommended threshold Slice2 is compulsorily set to one. When processing in step S505 is completed, this routine is temporarily ended. In a case where it is determined that the recommended threshold Slice2 is greater than one in step S504, this routine is temporarily ended as it is.

As above, by executing the chuck abnormality determination threshold determination routine, it is possible to automatically determine the recommended threshold Slice2.

REFERENCE SIGNS LIST

1 . . . spin unit
2 . . . camera
3 . . . image processing unit
4 . . . system main body control unit
5 . . . display unit

What is claimed is:

1. An automatic determination method of an inspection region for abnormality inspection of a substrate holding state in a substrate processing system including:
   a substrate holding unit configured to rotate a substrate being held in a substantially horizontal attitude;
   a processing control unit configured to add predetermined processing to the substrate in a state where the substrate holding unit is rotated; and
   an abnormality inspection unit configured to inspect abnormality of a holding state of the substrate by the substrate holding unit,
   the abnormality inspection unit including:
   an imaging unit configured to acquire a first image by photographing the substrate being held by the substrate holding unit from a horizontal direction;
   a cut out unit configured to cut out, from the first image, a second image corresponding to the inspection region positioned above the substrate being properly held by the substrate holding unit; and
   a determination unit configured to obtain a feature quantity indicating the holding state of the substrate by the substrate holding unit and to perform abnormality determination of the holding state based on the feature quantity on the second image,
   the automatic determination method comprising:
   upper end surface confirming in which an upper end surface of the substrate being normally held by the substrate holding unit is confirmed in the first image;
   vertical position determining in which a position of the inspection region in a vertical direction is determined based on a position of the upper end surface of the substrate in the first image having been confirmed in the upper end surface confirming; and
   horizontal position determining in which, for a candidate of the inspection region for which the position in the vertical direction has been determined, density at a rotation start time of the substrate holding unit is obtained, a difference image integrated value being an integrated value of a difference absolute value with density of the same region in an initial state of the substrate holding unit is obtained, and a horizontal position of the inspection region is determined based on the difference image integrated value having been obtained.

2. The automatic determination method of the inspection region for the abnormality inspection of the substrate holding state according to claim 1, wherein
   in the horizontal position determining, the horizontal position of the inspection region is a position at which the difference image integrated value is the minimum.

3. The automatic determination method of the inspection region for the abnormality inspection of the substrate holding state according to claim 1, wherein
   in the upper end surface confirming, the position of the upper end surface of the substrate is confirmed to a position at which a difference value of density between a pixel at a predetermined horizontal position of the first image and an adjacent pixel related to the vertical direction is equal to or greater than a predetermined multiple of a standard deviation of density in each pixel related to the vertical direction.

4. The automatic determination method of the inspection region for the abnormality inspection of the substrate holding state according to claim 1, wherein
the feature quantity is determined based on the difference image integrated value, and
a threshold of the feature quantity used for the abnormality determination of the holding state of the substrate is determined based on an average value and a standard deviation of the difference image integrated value in the inspection region of the first image during rotation of the substrate holding unit.

5. The automatic determination method of the inspection region for the abnormality inspection of the substrate holding state according to claim 1, wherein
the first image at the rotation start time of the substrate holding unit is an image in which the substrate being held by the substrate holding unit is photographed from the horizontal direction by the imaging unit at a point of time when the difference image integrated value within a predetermined rotation start determination region exceeds a predetermined second threshold.

6. The automatic determination method of the inspection region for the abnormality inspection of the substrate holding state according to claim 5, wherein
a position of the rotation start determination region is determined to a position at which the difference image integrated value is the maximum in the first image among the plurality of first images photographed for every predetermined period from a stopped state of the substrate holding unit to after a rotation start thereof, the first image being photographed before the first image for which the difference image integrated value is the maximum for the whole first images, and the first image being immediately before the first image in which a change of the difference image integrated value from the previous first image exceeds a predetermined third threshold.

7. The automatic determination method of the inspection region for the abnormality inspection of the substrate holding state according to claim 5, wherein
the second threshold is determined based on an average value and a standard deviation of the difference image integrated value of the rotation start determination region of the first image during a stop of the substrate holding unit.

8. The automatic determination method of the inspection region for the abnormality inspection of the substrate holding state according to claim 7, wherein
the second threshold is further determined based on a maximum value of the difference image integrated value of the rotation start determination region of the first image during a stop of the substrate holding unit and a minimum value of the difference image integrated value of the rotation start determination region of the first image at the rotation start time.

9. A substrate processing system comprising:
a substrate holding unit configured to rotate a substrate being held in a substantially horizontal attitude;
a processing control unit configured to add predetermined processing to the substrate in a state where the substrate holding unit is rotated; and
an abnormality inspection unit configured to inspect abnormality of a holding state of the substrate by the substrate holding unit,
the abnormality inspection unit including:
an imaging unit configured to acquire a first image by photographing the substrate being held by the substrate holding unit from a horizontal direction;
a cut out unit configured to cut out, from the first image, a second image corresponding to an inspection region positioned above the substrate being properly held by the substrate holding unit; and
a determination unit configured to obtain a feature quantity indicating the holding state of the substrate by the substrate holding unit and to perform abnormality determination of the holding state based on the feature quantity on the second image,
the substrate processing system further comprising:
an inspection region determination unit configured to determine the inspection region for abnormality inspection of the holding state of the substrate, wherein
the inspection region determination unit includes:
an upper end surface confirmation unit configured to confirm an upper end surface of the substrate being normally held by the substrate holding unit in the first image;
a vertical position determination unit configured to determine a position of the inspection region in a vertical direction based on a position of the upper end surface of the substrate in the first image having been confirmed by the upper end surface confirmation unit; and
a horizontal position determination unit configured to, for a candidate of the inspection region for which the position in the vertical direction has been determined, obtain density at a rotation start time of the substrate holding unit, obtain a difference image integrated value being an integrated value of a difference absolute value with density of the same region in an initial state of the substrate holding unit, and determine a horizontal position of the inspection region based on the difference image integrated value having been obtained.

10. The substrate processing system according to claim 9, wherein
the horizontal position determination unit positions the horizontal position of the inspection region to a position at which the difference image integrated value is the minimum.

11. The substrate processing system according to claim 9, wherein
the upper end surface confirmation unit confirms the position of the upper end surface of the substrate to a position at which a difference value of density between a pixel at a predetermined horizontal position of the first image and an adjacent pixel related to the vertical direction is equal to or greater than a predetermined multiple of a standard deviation of density in each pixel related to the vertical direction.

12. The substrate processing system according to claim 9, wherein
the feature quantity is determined based on the difference image integrated value, and
a threshold of the feature quantity used for the abnormality determination of the holding state of the substrate is determined based on an average value and a standard deviation of the difference image integrated value in the inspection region of the first image during rotation of the substrate holding unit.

13. The substrate processing system according to claim 9, wherein
the first image at the rotation start time of the substrate holding unit is an image in which the substrate being held by the substrate holding unit is photographed from the horizontal direction by the imaging unit at a point of time when the difference image integrated value within a predetermined rotation start determination region exceeds a predetermined second threshold.

14. The substrate processing system according to claim 13, wherein
a position of the rotation start determination region is determined to a position at which the difference image integrated value is the maximum in the first image among the plurality of first images photographed for every predetermined period from a stopped state of the substrate holding unit to after a rotation start thereof, the first image being photographed before the first image for which the difference image integrated value is the maximum for the whole first images, and the first image being immediately before the first image in which a change of the difference image integrated value from the previous first image exceeds a predetermined third threshold.

15. The substrate processing system according to claim 13, wherein
the second threshold is determined based on an average value and a standard deviation of the difference image integrated value of the rotation start determination region of the first image during a stop of the substrate holding unit.

16. The substrate processing system according to claim 15, wherein
the second threshold is further determined based on a maximum value of the difference image integrated value of the rotation start determination region of the first image during a stop of the substrate holding unit and a minimum value of the difference image integrated value of the rotation start determination region of the first image at the rotation start time.

* * * * *